US010383213B1

(12) United States Patent
Chengson et al.

(10) Patent No.: US 10,383,213 B1
(45) Date of Patent: Aug. 13, 2019

(54) PLACEMENT OF VIAS IN PRINTED CIRCUIT BOARD CIRCUITS

(71) Applicant: Juniper Networks, Inc., Sunnyvale, CA (US)

(72) Inventors: David P. Chengson, Aptos, CA (US); Edward C. Chang, Saratoga, CA (US); Ranjeeth Doppalapudi, San Jose, CA (US); Santosh Kumar Pappu, Sunnyvale, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 0 days.

(21) Appl. No.: 16/283,119

(22) Filed: Feb. 22, 2019

Related U.S. Application Data

(62) Division of application No. 15/385,161, filed on Dec. 20, 2016, now Pat. No. 10,231,325.

(51) Int. Cl.
*H05K 1/02* (2006.01)
*H05K 1/11* (2006.01)
*H05K 3/40* (2006.01)
*H05K 3/00* (2006.01)
*H05K 1/18* (2006.01)

(52) U.S. Cl.
CPC .......... *H05K 1/0228* (2013.01); *H05K 1/113* (2013.01); *H05K 1/181* (2013.01); *H05K 3/0005* (2013.01); *H05K 3/4007* (2013.01); *H05K 3/4038* (2013.01); *H05K 2201/10015* (2013.01)

(58) Field of Classification Search
CPC .............................. H05K 1/0228; H05K 1/113
See application file for complete search history.

(56) References Cited

U.S. PATENT DOCUMENTS

| 6,713,685 | B1 | 3/2004 | Cotton |
| 7,155,821 | B1 | 1/2007 | Downes et al. |
| 7,705,246 | B1 | 4/2010 | Pritchard et al. |
| 9,106,203 | B2 | 8/2015 | Kesler et al. |
| 9,172,145 | B2 | 10/2015 | Puzella et al. |
| 9,185,794 | B1 * | 11/2015 | Reynov ................... H05K 3/30 |

(Continued)

OTHER PUBLICATIONS

"Basic Linear Desig—Chapter 12: Printed Circuit Board (PCB) Design Issues," Analog Devices, Inc., Nov. 2006, 97 pp.

(Continued)

*Primary Examiner* — Hoa C Nguyen
(74) *Attorney, Agent, or Firm* — Shumaker & Sieffert, P.A.

(57) ABSTRACT

In some examples, an electronic device includes a printed circuit board (PCB) device that includes a first trace electrically connected to a first pad of a first trace via on a first layer and a second trace electrically connected to a second pad of a second trace via on a second layer. In some examples, the PCB device also includes four ground pads on the first layer and an antipad surrounding the two trace vias, where a first ground pad is positioned between the first trace and the second trace, where the first ground pad and the second ground pad are approximately symmetrically positioned about a perpendicular bisector of a line from the first pad to the second pad, and wherein the third ground pad and the fourth ground pad are approximately symmetrically positioned about the perpendicular bisector of the line from the first pad to the second pad.

15 Claims, 12 Drawing Sheets

(56) References Cited

U.S. PATENT DOCUMENTS

| | | | |
|---|---|---|---|
| 9,585,259 B1 | 2/2017 | Reynov et al. | |
| 9,698,607 B2 | 7/2017 | Kesler et al. | |
| 9,706,656 B2 | 7/2017 | Hsu et al. | |
| 9,730,313 B2 | 8/2017 | Gailus et al. | |
| 10,231,325 B1 | 3/2019 | Chengson et al. | |
| 2003/0123236 A1 | 7/2003 | McGrath et al. | |
| 2004/0112617 A1 | 6/2004 | Cotton | |
| 2008/0001286 A1 | 1/2008 | Leader et al. | |
| 2008/0227311 A1* | 9/2008 | Chan | H05K 1/0216 439/74 |
| 2009/0188711 A1* | 7/2009 | Ahmad | H05K 1/0245 174/262 |
| 2010/0000777 A1 | 1/2010 | Zhao et al. | |
| 2013/0056253 A1 | 3/2013 | Biddle et al. | |
| 2013/0056254 A1 | 3/2013 | Biddle et al. | |
| 2013/0056255 A1* | 3/2013 | Biddle | H05K 1/0245 174/266 |
| 2013/0175078 A1* | 7/2013 | Pai | H05K 1/11 174/264 |
| 2014/0326495 A1* | 11/2014 | Paniagua | H05K 1/0251 174/266 |
| 2015/0069831 A1 | 3/2015 | Kesler et al. | |
| 2015/0114706 A1* | 4/2015 | Rose | H05K 1/0245 174/262 |
| 2016/0007471 A1 | 1/2016 | Nagese et al. | |
| 2016/0150633 A1 | 5/2016 | Cartier, Jr. | |
| 2016/0150639 A1 | 5/2016 | Gailus et al. | |
| 2016/0150645 A1 | 5/2016 | Gailus et al. | |
| 2016/0184041 A1 | 6/2016 | Gafford et al. | |
| 2016/0302301 A1 | 10/2016 | Kim et al. | |
| 2017/0105284 A1* | 4/2017 | Akagawa | H01L 23/49844 |
| 2017/0196079 A1 | 7/2017 | Morgan et al. | |

OTHER PUBLICATIONS

LaMeres, "Characterization of a Printed Circuit Board VIA," Montana State University, accessed in 2000, 60 pp. (Applicant points out, in accordance with MPEP 609.04(a), that the year of publication, 2000, is sufficiently earlier than the effective U.S. filing date, so that the particular month of publication is not in issue.).

"Pad & Via Templates and Libraries," Altium Limited, modified May 6, 2016, accessed from http://techdocs.altium.com/display/ADOH/Pad+&+Via+Templates+and+Libraries, 19 pp.

"Saturn PCB Design Toolkit Help," Saturn PCB Design, Inc., accessed on Dec. 6, 2016, from https://www.saturnpcb.com/toolkit_help.htm, 2 pp.

"Saturn PCB Design Toolkit Version 7.02," Saturn PCB Design, Inc., accessed on Dec. 6, 2016, from https://www.saturnpcb.com/pcb_toolkit.htm, 13 pp.

U.S. Appl. No. 15/389,607, by Juniper Networks, Inc. (Inventors: Nair et al), filed Dec. 23, 2016.

Prosecution History from U.S. Appl. No. 15/385,161, dated Feb. 15, 2018 through Nov. 1, 2018 50 pp.

* cited by examiner

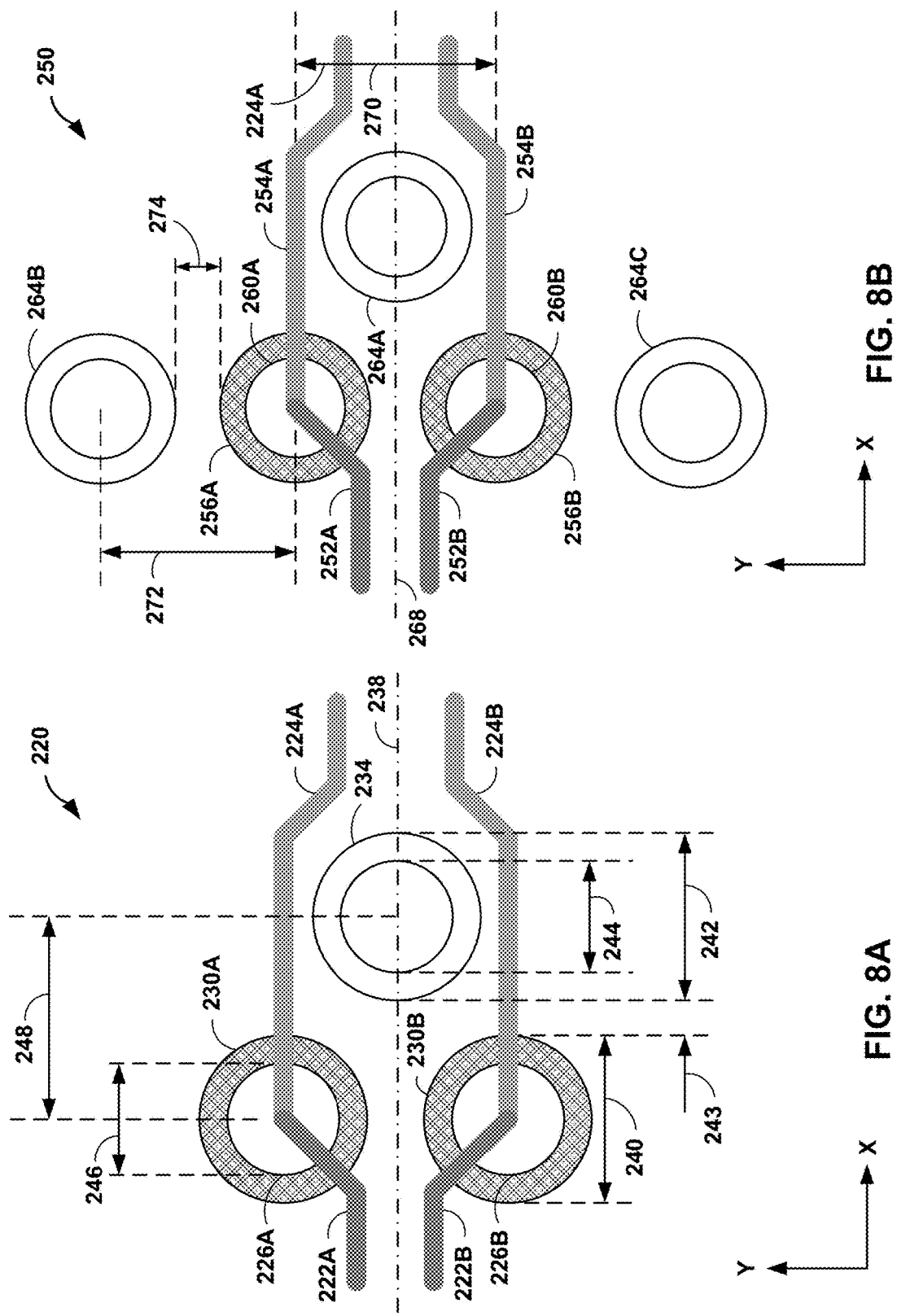

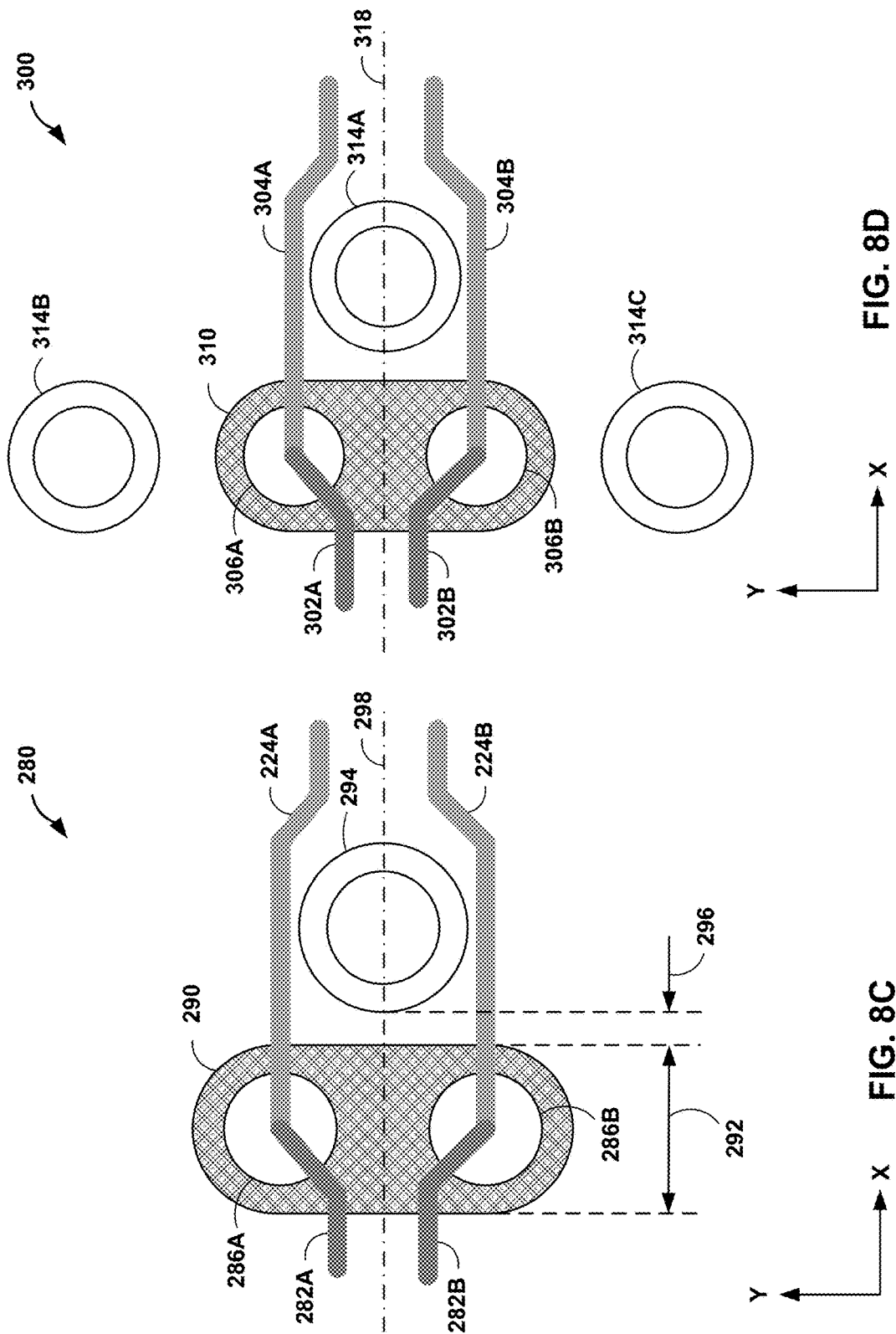

PLACEMENT OF VIAS IN PRINTED CIRCUIT BOARD CIRCUITS

This application is a divisional of U.S. patent application Ser. No. 15/385,161, filed on Dec. 20, 2016, the entire content of which is incorporated by reference herein.

TECHNICAL FIELD

This disclosure relates to the design of electronic circuits on printed circuit boards.

BACKGROUND

A printed circuit board (PCB) may provide mechanical support for an electronic circuit that includes components mounted to the PCB. The PCB may include traces to electrically connect structures on the PCB and/or components mounted on the PCB. The PCB may include one or more layers, where a trace on one layer may be electrically connected to a trace on another layer or to the other layer through an electrical connection called a "via."

Traces on a PCB may be organized as differential pairs. An electrical signal may travel through each trace of a differential pair of traces, where the two electrical signals may define a differential signal. In some examples, a differential clock signal or a data signal may travel through a differential pair of traces. The traces of an edge-coupled differential pair may be positioned substantially parallel to each other on a layer of a PCB. The traces of a broadside-coupled differential pair may be positioned substantially parallel to each other on two different layers of a PCB.

The flow of electrical signals through a trace or a via on a PCB may create electromagnetic waves that may affect the flow of electrical signals through other traces or vias in the PCB. The electromagnetic waves may be referred to as noise, interference, or crosstalk. The trace or via creating the electromagnetic waves may be referred to as the aggressor trace or aggressor via. The trace(s) or via(s) affected by the electromagnetic waves may be referred to as the victim(s).

In an electronic device, a PCB may include two or more differential pairs of traces, where each trace is positioned substantially parallel to the other traces. Each trace may operate as an aggressor with respect to other traces because the electrical signals in each respective trace may generate electromagnetic fields and waves that affect the transmission of electrical signals through other traces and other vias. Thus, each trace may be a victim and/or an aggressor, depending on which trace is being analyzed.

SUMMARY

This disclosure describes a technique for designing a printed circuit board (PCB) including placing ground vias in an array around trace vias to reduce the effect of PCB noise, interference, or crosstalk, generically referred to as noise, on the trace vias. In some examples, reducing the PCB noise may allow closer positioning of traces and vias, higher routing density, and higher cross-sectional bandwidths for some devices. The placement of ground vias may reduce the effect of an aggressor trace or an aggressor via on a differential pair of victim traces and/or a differential pair of victim vias. The effect of the aggressor on the victim pair may be reduced by positioning the aggressor at an equal distance from each of the victims. In some examples, a first ground via may be positioned between two differential victim traces. The first ground via may be approximately symmetrically positioned about a perpendicular bisector of a line from a first trace via to a second trace via, where the first pad is electrically connected to a first trace of the differential pair and the second pad is electrically connected to a second trace of the differential pair.

In some examples, the disclosure describes an electronic device comprising a PCB device including a first trace on a first layer and a second trace on a second layer, wherein the second trace is electrically isolated from the first trace. The PCB device further includes a first trace via including a first pad on the first layer, wherein the first pad is electrically connected to the first trace, and a second trace via including a second pad on the second layer, wherein the second pad is electrically connected to the second trace. The PCB device also includes an antipad surrounding the first trace via and the second trace via, a first ground via through the first layer and electrically connected to a ground plane, wherein the first ground via includes a first ground pad on the first layer positioned between the first trace and the second trace, and a second ground via through the first layer and electrically connected to the ground plane, wherein the second ground via includes a second ground pad on the first layer, wherein the first ground pad and the second ground pad are approximately symmetrically positioned about a perpendicular bisector of a line from the first pad to the second pad. The PCB device includes a third ground via through the first layer and electrically connected to the ground plane, wherein the third ground via includes a third ground pad on the first layer, and a fourth ground via through the first layer and electrically connected to the ground plane, wherein the fourth ground via includes a fourth ground pad on the first layer, wherein the third ground pad and the fourth ground pad are approximately symmetrically positioned about the perpendicular bisector of the line from the first pad to the second pad.

In some examples, the disclosure describes a method for designing a printed circuit board (PCB) device, the method including designing the PCB device including a differential pair of traces. The method further includes simulating differential electrical signals through the differential pair of traces based on electromagnetic noise emitted by at least one other structure on the PCB device. The method also includes measuring one or more parameters of the differential electrical signals through the differential pair of traces based on simulating the differential electrical signals.

In some examples, the disclosure describes an electronic device comprising a PCB device including a first trace on a first layer and a second trace on a second layer, wherein the second trace is electrically isolated from the first trace. The PCB device further includes a first trace via including a first pad on the first layer, wherein the first pad is electrically connected to the first trace, and a second trace via including a second pad on the second layer, wherein the second pad is electrically connected to the second trace. The PCB device also includes at least one antipad surrounding the first trace via and the second trace via. The PCB device includes a first ground via electrically connected to a ground plane, wherein the first ground via includes a first ground pad on the first layer positioned between the first trace and the second trace, wherein the first ground pad is approximately centered on a perpendicular bisector of a line from the first pad to the second pad.

In some examples, the disclosure describes a method for constructing a PCB, the method including drilling a first trace via, a second trace via, a first ground via, a second ground via, a third ground via, and a fourth ground via in the PCB. The method further includes filling the first trace via, a second trace via, a first ground via, a second ground via, a third ground via, and a fourth ground via with conductive material. The method also includes forming a first pad on a first layer of the PCB that is electrically connected to the conductive material of the first trace via. The method includes forming a second pad on a second layer that is electrically connected to the conductive material of the second trace via. The method further includes forming a first ground pad on the first layer that is electrically connected to the conductive material of the first ground via, wherein the first ground pad is positioned between the first trace and the second trace. The method also includes forming a second ground pad on the first layer that is electrically connected to the conductive material of the second ground via, wherein the first ground pad and the second ground pad are approximately symmetrically positioned about a perpendicular bisector of a line from the first pad to the second pad. The method includes forming a third ground pad on the first layer that is electrically connected to the conductive material of the third ground via. The method includes forming a fourth ground pad on the first layer that is electrically connected to the conductive material of the fourth ground via, wherein the third ground pad and the fourth ground pad are approximately symmetrically positioned about the perpendicular bisector. The method also includes etching an antipad surrounding the first trace via and the second trace via, and forming a first trace on the first layer and a second trace on the second layer, wherein the first trace is electrically connected to the first pad, and wherein the second trace is electrically connected to the second pad.

The details of one or more examples are set forth in the accompanying drawings and the description below. Other features, objects, and advantages will be apparent from the description and drawings, and from the claims.

BRIEF DESCRIPTION OF DRAWINGS

FIGS. 8A-8D are conceptual diagrams illustrating additional example placements of vias, traces, and antipads, in some examples of this disclosure.

DETAILED DESCRIPTION

Figure 1:
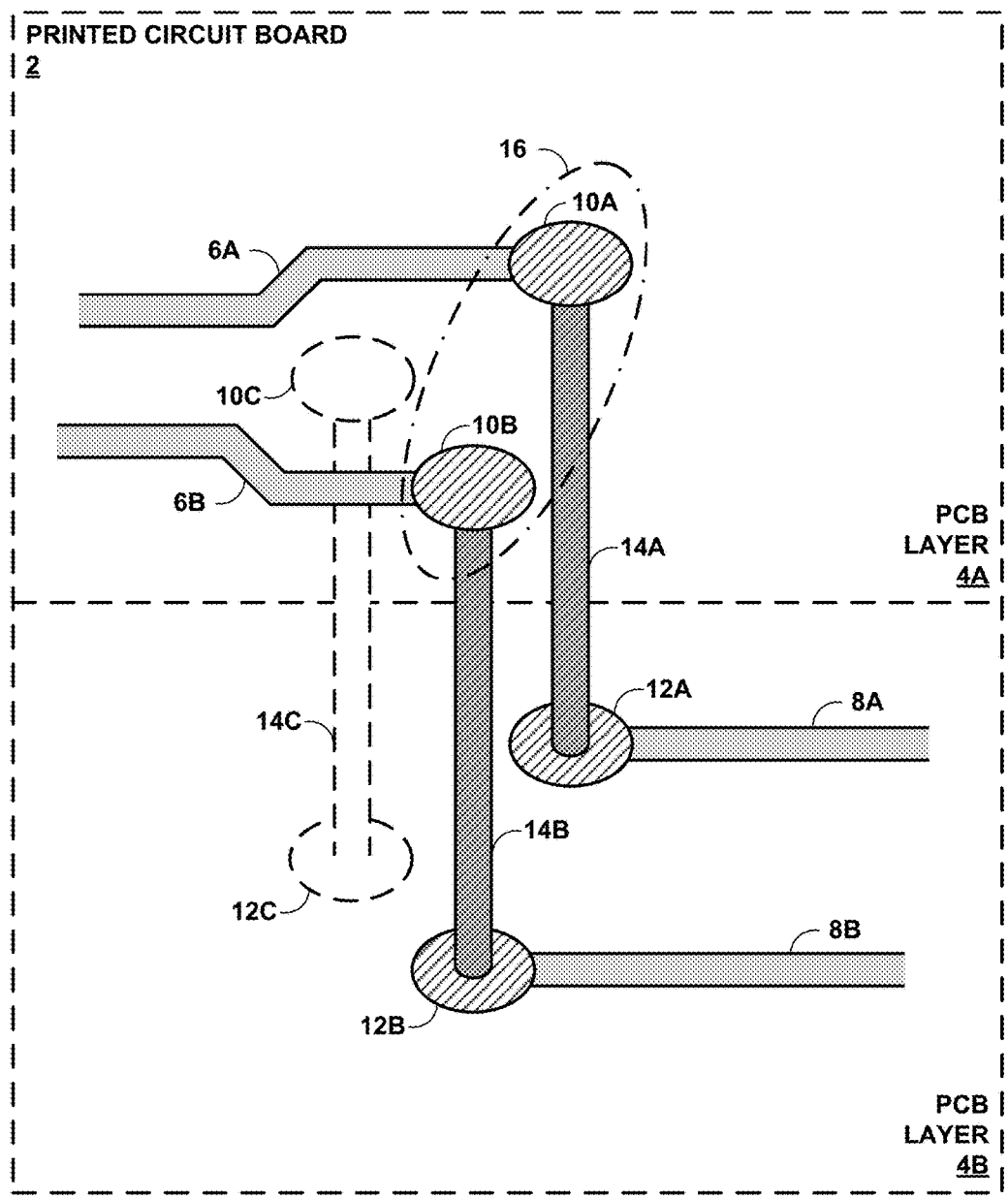
FIG. 1 is a conceptual diagram illustrating a printed circuit board (PCB) including two layers and three vias, in some examples of this disclosure.

In some examples, a printed circuit board (PCB) may include one or more differential pairs of traces, where a differential pair of traces may be configured to transmit a differential signal such as a data signal and/or a clock signal (e.g., an electrical signal). One technique of designing a PCB known as "single-ended analysis" may include simulating the effect of other traces and vias (i.e., "aggressors") on each trace of a differential pair of traces. By individually simulating the behavior of electrical signals traveling through each trace of the differential pair of traces, a designer may include overly conservative spacing (e.g., more spacing than needed) between each adjacent differential pair. A designer may also include an overly conservative number of ground vias (e.g., more ground vias than needed) between each adjacent differential pair.

On a PCB, minimizing space between differential pairs traces and generally minimizing space may be beneficial, allowing for additional traces and components. Accordingly, overly conservative spacing and an overly conservative number of ground vias may consume space on the PCB that may be better served by including additional traces or components.

In contrast, by simulating the effect of an aggressor on both traces and/or vias of a differential pair, known as differential analysis, a designer may reduce the spacing between each adjacent differential pair. For example, an aggressor may have an approximately equal effect on each trace and/or via of a differential pair. As compared to an aggressor with an unequal effect on two traces and/or two vias of a differential pair, an aggressor with an approximately equal effect on each trace and/or via of a differential pair may cause less disruption to the transmission of electrical signals traveling through the differential pair. This is because in the differential signal traveling on the differential pair, a first signal of the differential signal subtracts the other signal of the differential signal meaning that if the effect is equal on both signals, then the effect would be canceled out as part of the subtraction.

A designer implementing differential analysis may position structures on a PCB such that the impact on differential pairs is canceled out. The designer may therefore include closer spacing and fewer ground vias between adjacent differential pairs, as compared to a designer implementing single-ended analysis.

In some examples, a differential pair of traces may be electrically connected to a differential pair of trace vias. To reduce the effect of a ground via on differential signals traveling through the differential pair, the ground via may be approximately centered on a perpendicular bisector of a line from the first trace via to the second trace via. The perpendicular bisector may be defined as a line that includes all of the points that are equidistant from the first trace via and the second trace via. A ground via may be centered on the perpendicular bisector if the ground via is positioned such that the perpendicular bisector passes through the center of the ground via. In some examples, a first ground via and a second ground via may be approximately symmetrically positioned about the perpendicular bisector, to balance the effects of the first ground via and the second ground via on the differential pair of traces and vias. Positioning a pair of ground vias approximately symmetrically about the perpendicular bisector may be especially effective at balancing the effects of the ground vias if each ground via carries substantially the same signal.

FIG. 1 is a conceptual diagram illustrating a PCB 2 including two layers 4A, 4B and three vias 14A-14C, in some examples of this disclosure. PCB 2 may include additional layers, traces, pads, and vias not shown in FIG. 1. PCB 2 may be configured to electrically connect one or more surface-mount technology (SMT) components, such as integrated circuits (ICs), transistors, capacitors, resistors, and/or any other suitable structures and SMT components. PCB 2 may include one or more copper sheets that are laminated onto a non-conductive substrate. Although only two layers are depicted in FIG. 1, PCB 2 may include three or more layers. PCB 2 may include one or more exterior layers (e.g., top and bottom layers) known as microstrip layers and one or more interior layers (e.g., layers sandwiched between top and bottom layers) known as stripline layers.

PCB layers 4A, 4B may include electrically conductive material, and non-conductive material may be positioned between PCB layers 4A, 4B such that electricity generally does not flow between PCB layers 4A, 4B. Each of PCB layers 4A, 4B may include non-conductive material such as antipads, solder mask, and/or any other non-conductive material. In some examples, PCB layer 4A may be a microstrip layer, and PCB layer 4B may be a stripline layer. Although FIG. 1 depicts traces 6A and 6B as an edge-coupled pair on PCB layer 4A, traces 6A and 6B may be a broadside-coupled pair where trace 6A is on a different layer than trace 6B.

Microstrip layers and stripline layers may include different propagation of electromagnetic fields and waves. A stripline layer may include transverse electromagnetic (TEM) mode propagation because there may be another PCB layer on the top side of the stripline layer and another PCB layer the bottom side of the stripline layer. A microstrip layer may include quasi-TEM mode propagation because there may be another PCB layer on only one of the top side or the bottom side. There may be air or open space on the opposite side of the microstrip layer, and the air may include higher velocity propagation than the PCB layer on the other side of the microstrip layer.

Traces 6A, 6B are a differential pair of traces that may be configured to carry a clock signal or a data signal. Trace 6A may be referred to as a "positive trace" or a "p trace," and trace 6B may be referred to as a "negative trace" or an "n trace." Traces 6A, 6B, may include conductive material such as copper, solder, aluminum, and/or any other suitable material. In some examples, traces 6A, 6B may be configured to transmit data between two serial-deserializer ("serdes") components within a network device such as a router. In some examples, traces 6A, 6B may be configured to transmit a clock signal from clock generation circuitry to an IC mounted on PCB 2. Traces 6A, 6B may be configured to transmit a differential signal, where the data to be transferred is the difference between a signal on trace 6A and a signal on trace 6B. For example, a differential signal may be the electrical currents and/or voltages along trace 6A, 6B. The differential signal may include an amplitude of zero when the electrical current and/or voltage on trace 6A is equal to the electrical current and/or voltage on trace 6B.

Traces 8A, 8B are a differential pair of traces, where trace 8A is electrically connected to trace 6A through trace via 14A, and trace 8B is electrically connected to trace 6B through trace via 14B. Like traces 6A, 6B, traces 8A, 8B may include conductive material such as copper, solder, aluminum, and/or any other suitable material. Traces 8A, 8B may receive differential signals from traces 6A, 6B, and traces 8A, 8B may transmit differential signals to traces 6A, 6B. Two or more SMT components may transmit and receive data and/or clock signals through traces 6A, 6B, 8A, 8B.

It may be desirable to transmit a differential signal along traces 6A, 6B, 8A, 8B with little or no noise from nearby components. In some examples, electrical signals traveling through traces 6A, 6B, 8A, 8B may be affected by electromagnetic fields and waves from other components on or near PCB 2. The electrical signals traveling through traces 6A, 6B, 8A, 8B may also be affected by the impedance along traces 6A, 6B, 8A, 8B, which may be affected by the material in traces 6A, 6B, 8A, 8B and the electromagnetic fields and waves experienced by traces 6A, 6B, 8A, 8B.

In some examples, an electromagnetic field may have a greater impact on an electrical signal traveling through trace 6A than on an electrical signal traveling through trace 6B. However, if an electromagnetic field is generated by a structure that is equidistant from traces 6A, 6B and/or trace vias 14A, 14B, the electromagnetic field may have an equal effect on traces 6A, 6B and/or trace vias 14A, 14B. An equal effect on a differential pair of traces and/or vias may have a smaller impact on a differential signal, as compared to an electromagnetic field that affects a first trace or via more than a second trace or via of the differential pair. For example, the electromagnetic field may affect the electrical signals traveling through both differential traces. However, because the actual electrical signal (i.e., the differential signal) is based on the subtraction of the electrical signals on the differential traces, the effect from the electromagnetic field subtracts out if the effect is equal on each trace of the differential traces.

Pads 10A, 10B may be positioned on PCB layer 4A, and pads 12A, 12B may be positioned on PCB layer 4B. Pads 10A, 10B, 12A, 12B may include conductive material such as copper, solder, aluminum, and/or any other suitable material. Each of pads 10A, 10B, 12A, 12B may be encompassed by an antipad of non-conductive material to electrically insulate pads 10A, 10B, 12A, 12B from other portions of PCB 2. The antipad may extend through all layers of PCB 2 to electrically isolate vias 14A and 14B from the layers of PCB 2.

In some examples, pads 10A-10C, 12A-12C may be integrated with the structure of vias 14A-14C. Vias 14A-14C may be formed by drilling holes in PCB 2 with a laser or a mechanical drill, and vias 14A-14C may be plated-through holes. The holes may be filled with conductive material, such as copper, solder, aluminum, gold, and/or any other suitable conductive material. Pads 10A-10C, 12A-12C may be formed when the drilled holes are filled with conductive material, where pads 10A-10C, 12A-12C may include the same conductive material as vias 14A-14C. Therefore, pads 10A-10C, 12A-12C may not necessarily be separate or distinct structures from vias 14A-14C. Each of pads 10A-10C, 12A-12C may include the conductive material of one of vias 14A-14C without any extension of the structure of via 14A-14C onto a layer of PCB 2.

Ground pad 10C is positioned between trace 6A and trace 6B. Examples of ground pads that are positioned between a differential pair of traces are depicted in FIGS. 1, 2, 3, 7, and 8A-8D. In other examples, more than one ground pad may be positioned between trace 6A and trace 6B.

Trace via 14A is electrically connected to traces 6A, 8A, and trace via 14B is electrically connected to traces 6B, 8B. A differential signal may include two electrical signals, where a first electrical signal travels through trace 6A, trace via 14A, and trace 8A and a second electrical signal travels through trace 6B, trace via 14B, and trace 8B. The electrical signals travelling through the traces and trace vias of FIG. 1 may experience electromagnetic fields and waves generated by other structures not shown in FIG. 1, such as other traces that carry electrical signals. Ground via 14C may be electrically connected to a reference ground voltage through a ground layer of PCB 2 (not shown in FIG. 1). Ground via 14C may also be electrically connected to pad 10C on PCB layer 4A and pad 12C on PCB layer 4B. Ground via 14C may be electrically connected to all layers of PCB 2 except for power layers and any other layers that are not designed to have a ground connection.

Antipad 16 is a void area surrounding a via to prevent the via from conducting electricity with the layer on which antipad 16 is positioned. Antipad 16 may surround pads 10A, 10B and prevent the flow of electricity between pads 10A, 10B and the conductive material of PCB layer 4A. Antipad 16 is depicted as having an oval shape, but antipad 16 may include any other shape, such as a rounded rectangle, a rectangle, a circle, and/or any other suitable shape. In some examples, antipad 16 may include two separate antipads, where each separate antipad surrounds one of pads 10A, 10B. In some examples, antipad 16 may extend across, and/or be cut through, multiple layers of PCB 2 to insulate pads 12A, 12B and trace vias 14A, 14B from the conductive material of PCB 2.

The other structures of PCB 2, such as the traces, vias, and pads, may include antipads to prevent the flow of electricity between the traces, vias, and/or pads and nearby structures and components on PCB 2. For example, trace 6A may be surrounded by non-conductive material of PCB 2. The conductive material of PCB 2 that surrounds trace 6A may have been etched away to reveal non-conductive material, or non-conductive material such as solder mask may have been added to PCB 2 to electrically isolate trace 6A from nearby structures. Etching may include mechanical etching or chemical etching, possibly using acidic material.

In accordance with the techniques of this disclosure, ground pad 10C may be approximately centered on a perpendicular bisector of a line from pad 10A to pad 10B. The perpendicular bisector may be a line that includes all of the points that are equidistant from the center of each of pads 10A, 10B to reduce the differential effect of ground pad 10C and ground via 14C on pads 10A, 10B and trace vias 14A, 14B. Ground pad 10C may also be positioned equidistant from each of traces 6A, 6B to reduce the differential effect of ground pad 10C and ground via 14C on traces 6A, 6B. The differential effect of ground pad 10C and ground via 14C may be equal to the difference of the effect on trace 6A and the effect of trace 6B.

In some examples, a differential clock signal or a differential high-speed data signal may travel through traces 6A, 6B. Clock signals and high-speed data signals may be very sensitive to noise and crosstalk. In some examples, the threshold for differential crosstalk on the clock signal or the high-speed data signal may be minus eighty decibels or less. In some examples, a clock signal may include a Nyquist frequency of one hundred and fifty-five megahertz, and a data signal may include a Nyquist frequency of twelve-and-a-half gigahertz. A data signal with a Nyquist frequency of twelve-and-a-half gigahertz may include a data transfer rate of twenty-five gigabaud for two-level pulse amplitude modulation (PAM2) and a data transfer rate of fifty gigabaud for four-level pulse amplitude modulation (PAM4).

Ground pad 10C and ground via 14C may also block or reduce the effect of electromagnetic fields and waves generated by other components on PCB 2. Using single-ended analysis, the effect on trace 6A or trace 6B may exceed the noise threshold on traces 6A, 6B. In contrast, differential analysis may show that the impact on a differential signal traveling through traces 6A, 6B does not exceed the noise threshold. Differential analysis may be more accurate in calculating the effect of electromagnetic noise on a differential pair of traces. Differential analysis may allow for tighter spacing between differential pairs of traces when ground vias are positioned between the differential pairs to block noise. Differential analysis may also allow a designer to satisfy noise thresholds with a fewer ground vias, as compared to a designer using single-ended analysis.

Figure 2:
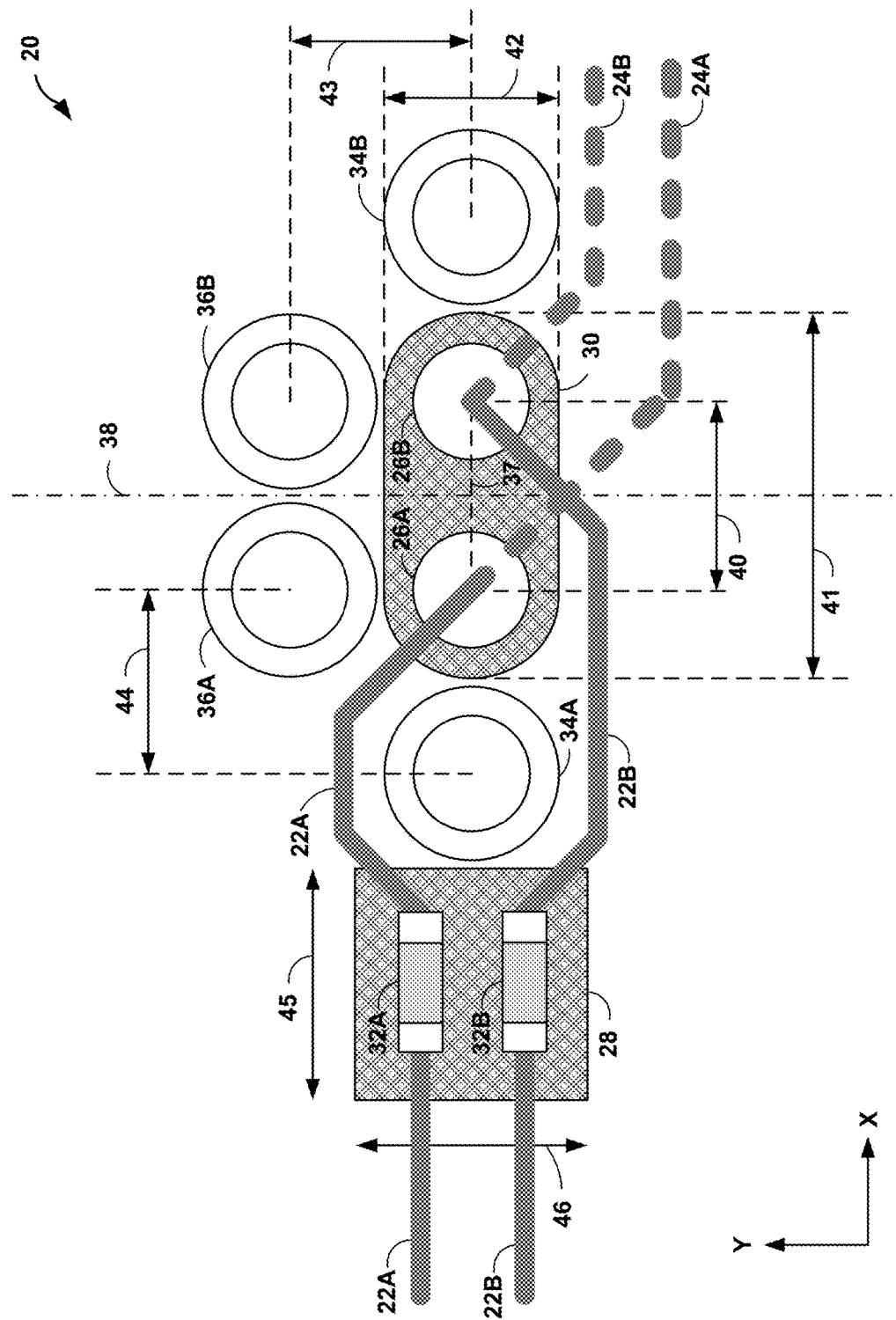
FIG. 2 is a conceptual diagram illustrating an example placement of vias, traces, and an antipad, in some examples of this disclosure.

FIG. 2 is a conceptual diagram illustrating an example placement of vias, traces 22A, 22B, 24A, 24B, and an antipad 30, in some examples of this disclosure. PCB 20 may also include trace pads 26A, 26B, antipad 28, capacitors 32A, 32B, ground pads 34A, 34B, 36A, 36B. PCB 20 may include two or more layers with vias that electrically connect portions of the layers. FIG. 2 may depict two PCB layers, where the structures are on the first PCB layer, and traces 24A, 24B are depicted structure on the second PCB layer.

Traces 22A, 22B are a differential pair of traces configured to carry a differential signal from a first component or structure on PCB 20 to a second component or structure on PCB 20. The first component or structure and second component or structure may include an IC such as a serdes or a clock-generation IC, a SMT component such as capacitors 32A, 32B or a resistor, and/or any other suitable component. Traces 22A and 22B may be an edge-coupled pair on a single layer of PCB 20, or traces 22A and 22B may be a broadside-coupled pair where trace 22A is on a different layer than trace 22B.

Traces 24A, 24B may be electrically connected to traces 22A, 22B through pads 26A, 26B and a differential pair of vias (not shown in FIG. 2). Traces 24A, 24B may be positioned on a different PCB layer of PCB 20 than the PCB layer that includes traces 22A, 22B.

Pads 26A, 26B may include conductive material to electrically connect traces 22A, 22B to trace vias that extend through multiple layers of PCB 20. Pads 26A, 26B may not include any additional conductive material beyond the structure of the trace vias. Although FIG. 2 depicts pads 26A, 26B on a single level, PCB 20 may also include pads on a second level for traces 24A, 24B to electrically connect to the trace vias.

Antipads 28, 30 may surround pads 26A, 26B and capacitors 32A, 32B to prevent or impede the flow of electricity between pads 26A, 26B and capacitors 32A, 32B and other portions of PCB 20. Antipads 28, 30 may be formed by mechanical etching or chemical etching through one or more layers of PCB 20. In some examples, each of pads 26A, 26B may be encompassed by a single antipad, where the antipads of each of pads 26A, 26B are not connected. Antipad 30 may include a capacitance due to the separation between, for example, pad 26A and ground pad 36A. The capacitance between, for example, pad 26A and ground pad 36A may be inversely proportional to the distance between pad 26A and ground pad 36A. Thus, tighter spacing between structures on PCB 20 may increase density and cross-sectional bandwidth, but tighter spacing may also increase the capacitance between the structures on PCB 20.

Capacitors 32A, 32B are connected in series with traces 22A 22B and may be configured to impede direct-current (DC) electrical signals on traces 22A, 22B. Traces 22A, 22B may transmit electrical signals between two ICs with different power-supply voltages. Capacitors 32A, 32B may present a lower impedance to the transmission of alternating-current (AC) electrical signals and a higher impedance to the transmission of DC electrical signals. In some examples, capacitors 32A, 32B may include SMT components that are soldered on to PCB 20. Capacitors 32A, 32B may include a discrete component such as a 0201 capacitor with a length in the x-axis direction of approximately six hundred micrometers and a width in the y-axis direction of approximately three hundred micrometers.

Each of ground pads 34A, 34B, 36A, 36B may include a pad of conductive material surrounded by an antipad of non-conductive material through all layers of PCB 20 except on power layers, also known as power planes. Each of ground pads 34A, 34B, 36A, 36B may be electrically connected to a ground via that is electrically connected to a ground plane of PCB 20. The ground plane of PCB 20 may include a reference voltage such as reference ground. In some examples, PCB 20 may include more than one ground plane, where ground pads 34A, 34B may be electrically connected to one or more of the ground planes. In some examples, ground pad 34A may be electrically connected to a first ground plane, and ground pad 34B may be electrically connected to a second ground plane. Grounds pads 34A, 34B, 36A, 36B may not include any additional conductive material beyond the structure of the trace vias.

Ground pads 34A, 34B are approximately symmetrically positioned about perpendicular bisector 38 of line 37 from pad 26A to pad 26B. Ground pads 36A, 36B are approximately symmetrically positioned about perpendicular bisector 38. Line 37 may be a straight line from the center of pad 26A to the center of pad 26B. Perpendicular bisector 38 may be defined as a line that includes all points that are equidistant from the center of pad 26A and the center of pad 26B. Perpendicular bisector 38 may also be defined as a line that is perpendicular to line 37 and intersects line 37 at an equal distance from the center of pad 26A and the center of pad 26B.

For purposes of this disclosure, "approximately symmetrically positioned" may mean that a straight line from the center of ground pad 34A to the center of ground pad 34B intersects perpendicular bisector 38 at an angle greater than eighty degrees and less than one hundred degrees. "Approximately symmetrically positioned" may mean that the distance from one of ground pads 34A, 34B to perpendicular bisector 38 is less than ten percent longer than the distance from the other one of ground pads 34A, 34B to perpendicular bisector 38. Approximately may refer to distances within a threshold tolerance of symmetry such as less than a threshold distance (e.g., one hundred micrometers) away from a symmetrical position. The description of FIGS. 9A and 9B includes a definition of "approximately," as used herein.

Pads 26A, 26B may include center-on-center spacing 40 in the x-axis direction of approximately thirty-six mils or approximately forty mils (approximately nine hundred micrometers or one millimeter), where a mil is equal to one-thousandth of an inch or approximately twenty-five micrometers. For purposes of this disclosure, "approximately" with respect to a specific distance may be defined as including distances within ten percent of the specific distance. Antipad 30 may include length 41 in the x-axis direction of approximately seventy-six mils or approximately ninety mils (approximately nineteen hundred micrometers or twenty-three hundred micrometers). Length 41 may be the longest dimension of antipad 30 and may be greater than fifteen hundred micrometers and less than three millimeters.

Antipad 30 and ground pad 34B may include width 42 in the y-axis direction of approximately thirty mils or approximately forty mils (approximately seven hundred and fifty micrometers or one millimeter). Width 42 may be the shortest dimension of antipad 30. In some examples, ground pad 34B may include a shorter width in the y-axis direction of approximately twenty mils (approximately five hundred micrometers). Spacing 43 in the y-axis direction from line 37 to the center of ground pads 36A, 36B may be approximately thirty-two mils, approximately thirty-three mils, or approximately thirty-five mils (approximately eight hundred or nine hundred micrometers). In some examples, spacing 43 may be a center-on-center distance from pad 26B to ground pad 36B that is less than fifteen hundred micrometers.

Ground pads 34A, 36A may include center-on-center spacing 44 in the x-axis direction of greater than approximately thirty mils (approximately seven hundred and fifty micrometers) and less than approximately forty mils (approximately one thousand micrometers). In some examples, spacing 44 may be a center-on-center distance from pad 26A to ground pad 34A that is less than fifteen hundred micrometers. Antipad 28 may include length 45 in the x-axis direction of approximately fifty mils and width 46 in the y-axis direction of approximately fifty mils (approximately thirteen hundred micrometers by thirteen hundred micrometers). These dimensions are merely examples, and other dimensions are possible for the structure described in this disclosure.

The positioning of structures on PCB 20, as depicted in FIG. 2, may improve the transmission of differential signals through traces 22A, 22B, 24A, and 24B ("traces 22 and 24"). Differential signals traveling through traces 22 and 24 may be affected by noise from other structures on or near PCB 20. Noise that equally affects a first signal traveling through trace 22A and a second signal traveling through trace 22B may have less impact on determining the values from the differential signal including the first signal and the second signal, as compared to noise with an uneven effect on the first signal and the second signal. By positioning ground pads 34A, 34B, 36A, 36B approximately symmetrically about perpendicular bisector 38, the ground pads may have a more balanced effect on traces 22 and 24, and consequently less impact on determining the values from the differential signals traveling through traces 22 and 24.

Figure 3:
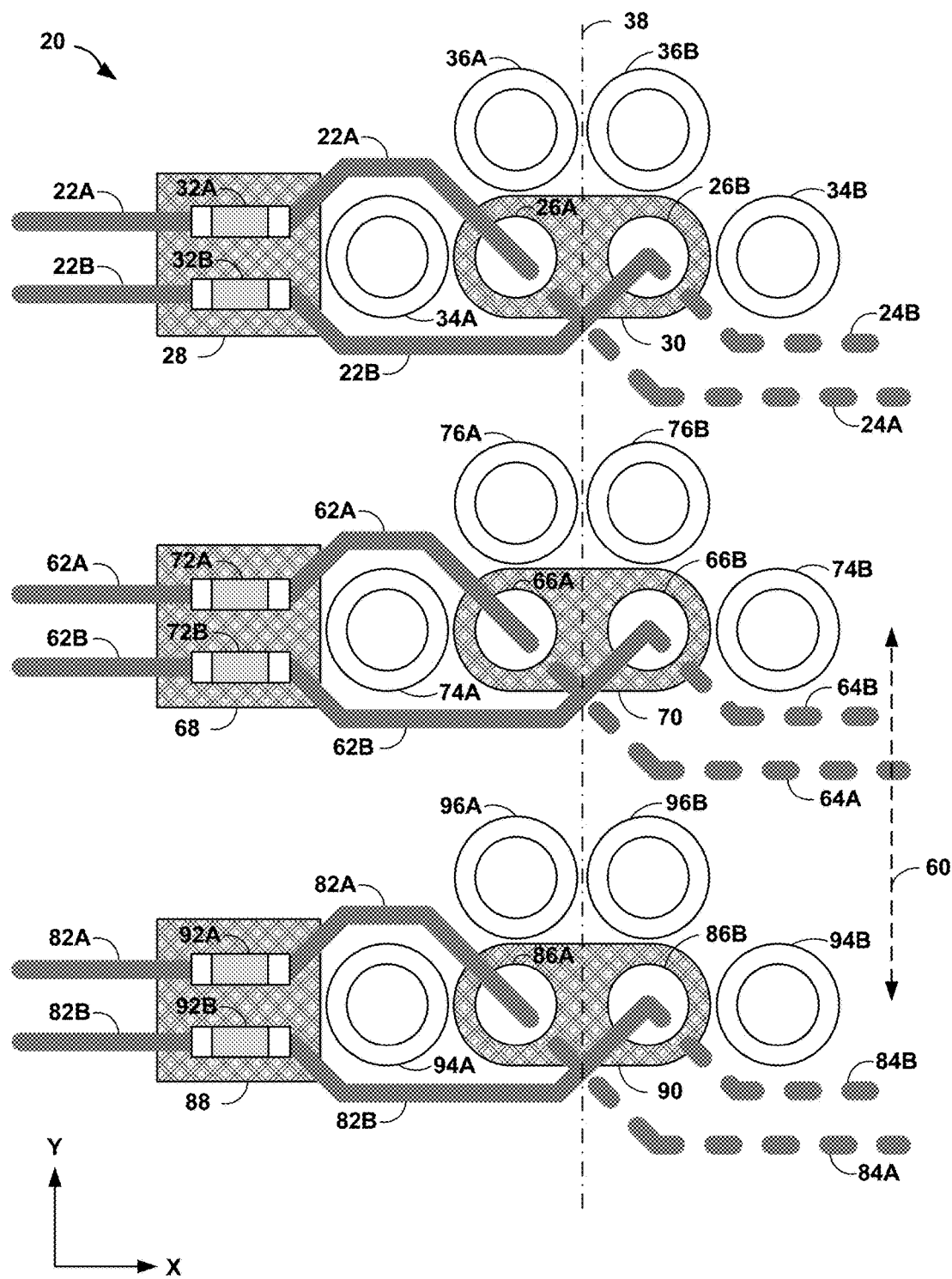
FIG. 3 is a diagram illustrating an example placement of vias, traces, and antipads for three differential transmission lines, in some examples of this disclosure.

FIG. 3 is a diagram illustrating an example placement of vias, traces, and antipads for three differential transmission lines, in some examples of this disclosure. Each differential transmission line in FIG. 3 includes differential traces 22A, 22B, 62A, 62B, 82A, 82B on a first PCB layer and differential traces 24A, 24B, 64A, 64B, 84A, 84B on a second PCB layer. Differential traces 22A, 22B, 62A, 62B, 82A, 82B may be electrically connected to a first IC such as a serdes or a clock-generation circuit. Differential traces 24A, 24B, 64A, 64B, 84A, 84B may be electrically connected to a second IC such as a serdes. In some examples, the second IC may be mounted on a surface of the first PCB layer, and differential traces 24A, 24B, 64A, 64B, 84A, 84B may be electrically connected to the second IC through vias (not shown in FIG. 3).

The ground pads of PCB 20 may block each differential pair of traces from electromagnetic noise generated by electrical signals traveling through the adjacent differential pairs of traces. Ground pads 74A, 74B, 76A, 76B may shield traces 22A, 22B from electromagnetic noise generated by electrical signals traveling through traces 62A, 62B. Ground pads 74A, 74B, 76A, 76B may also shield traces 62A, 62B from electromagnetic noise generated by electrical signals traveling through traces 22A, 22B. The electromagnetic noise may include electromagnetic fields and waves generated by electrical currents. The electromagnetic noise generated by electrical signals that affects the behavior of adjacent differential pairs of traces may be known as "crosstalk."

In some examples, PCB 20 may include more than three differential transmission lines, where the additional differential transmission lines include a similar arrangement to the components depicted in FIG. 3. In some examples, PCB 20 may include a center-on-center spacing 60 of approximately ninety-five mils or ninety-six mils (approximately twenty-three hundred micrometers) or less than three millimeters between adjacent differential transmission lines. Center-on-center spacing 60 may be defined as the distance between a center of gravity of antipad 70 and a center of gravity of antipad 90. Center-on-center spacing 60 may be defined as the distance between a point halfway between pads 66A, 66B and a point halfway between pads 76A, 76B. The center of gravity of a structure may be defined as a centroid or center of mass (assuming uniform density) of the structure. PCB 20 includes spacing 60 between differential pairs of traces that may be tighter than the spacing between differential pairs of traces in PCB devices that are designed using single-ended analysis. Tighter spacing may increase the cross-sectional bandwidth of PCB 20, which may be defined as the bits per second per unit area of PCB 20. Increasing the speed of the differential signals may also increase the cross-sectional bandwidth of PCB 20, but the speed of the differential signals may already be at or near a limit for the speed of signals through the differential pairs of traces.

Figure 4:
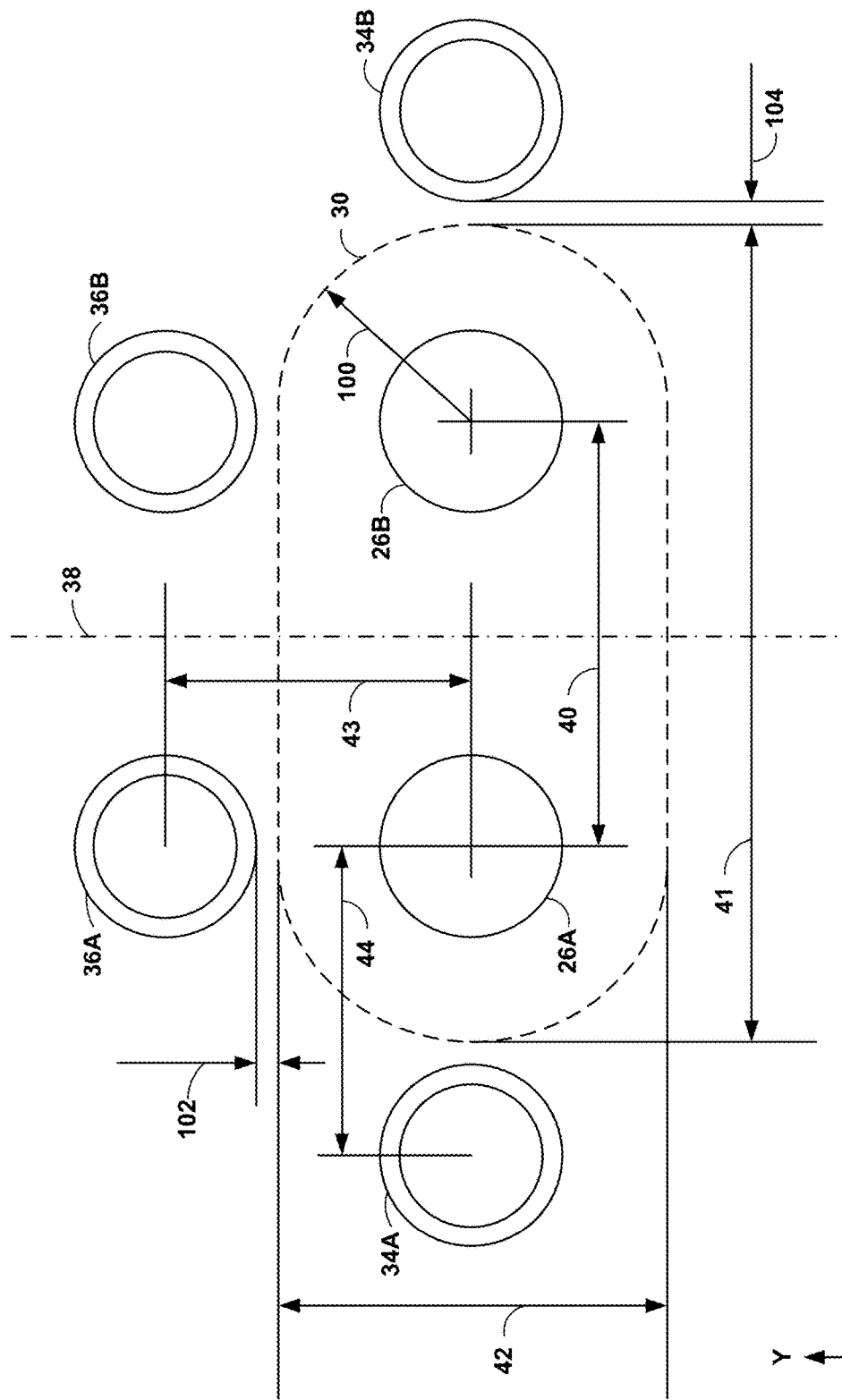
FIG. 4 is a diagram illustrating an example placement and dimensions of vias, pads, and an antipad including distance measurements, in some examples of this disclosure.

FIG. 4 is a diagram illustrating an example placement and dimensions of vias, pads, and antipad 30, in some examples of this disclosure. Dimensions 40-44 may be similar to dimensions 40-44 in FIG. 2. The rounded ends of antipad 30 may include radius 100 of approximately twenty mils or twenty-five mils (approximately five hundred micrometers or six hundred micrometers). Antipad 30 and ground pad 36A may include spacing 102 in the y-axis direction of approximately five mils or seven mils (approximately one hundred and twenty micrometers or one hundred and seventy micrometers). Antipad 30 and ground pad 34B may include spacing 104 in the x-axis direction of approximately five mils (approximately one hundred and twenty micrometers).

Figure 5A:
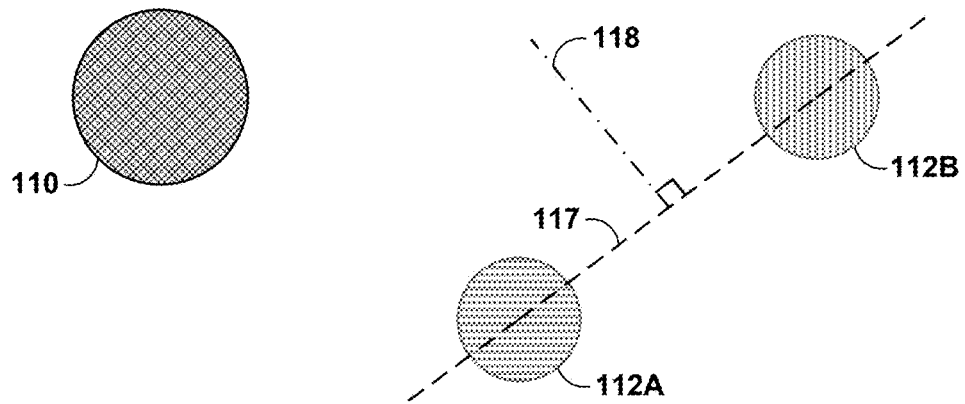
FIGS. 5A-5C are conceptual diagrams illustrating three example placements of an aggressor via and two victim vias, in some examples of this disclosure.
Figure 5B:
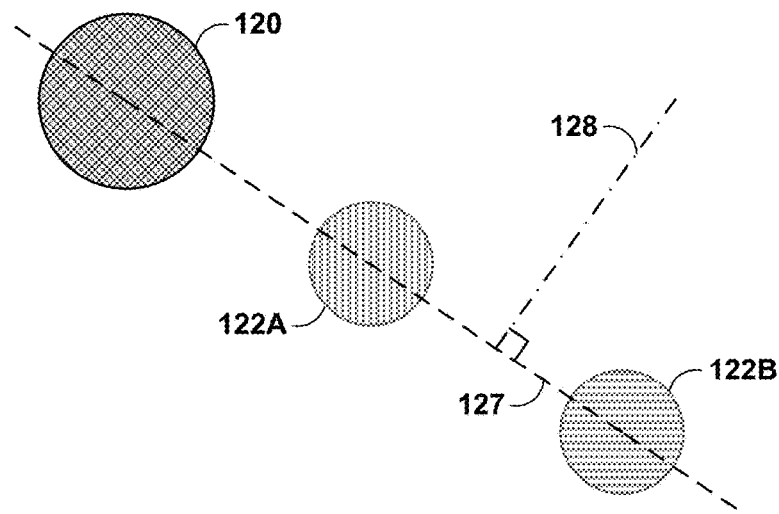
Figure 5C:
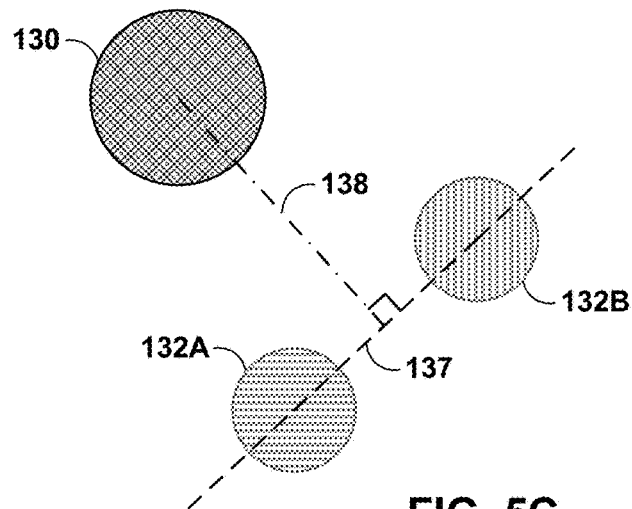

FIGS. 5A-5C are conceptual diagrams illustrating three example placements of an aggressor via and two victim vias, in some examples of this disclosure. For example, FIG. 5A depicts aggressor via 110 and a differential pair of victim vias 112A, 112B. Aggressor via 110 is not positioned on line 117 from victim via 112A to victim via 112B, and aggressor via 110 is not positioned on perpendicular bisector 118, which may be defined as a line that includes all points that are equidistant from the center of victim via 112A and the center of victim via 112B. The distance between aggressor via 110 and victim via 112A may be shorter than the distance between aggressor via 110 and victim via 112B. As a result, electromagnetic noise generated by an electrical signal traveling through aggressor via 110 may have a greater effect on victim via 112A than on victim via 112B.

FIG. 5B depicts aggressor via 120 and a differential pair of victim vias 122A, 122B. Aggressor via 120 may be positioned approximately on line 127, where line 127 extends from victim via 122A to victim via 122B. Electromagnetic noise generated by an electrical signal traveling through aggressor via 120 may have a greater effect on victim via 122A than on victim via 122B. The difference in the effect on victim via 122A and the effect on victim via 122B may be large when aggressor via 120 is positioned on line 127 because aggressor via 120 may be much closer to victim via 122A than to victim via 122B. Thus, the positioning of aggressor via 120 relative to victim vias 122A, 122B, as depicted in FIG. 5B, may be the worst-case scenario, relative to FIGS. 5A and 5B, for the behavior of differential signals traveling through victim vias 122A, 122B because the difference between the impact on victim via 122A and the impact on victim via 122B may be at or near a maximum.

FIG. 5C depicts aggressor via 130 and a differential pair of victim vias 132A, 132B. Aggressor via 130 may be positioned approximately on perpendicular bisector 138, where perpendicular bisector 138 is defined as a line that includes all points that are equidistant from the center of victim via 132A and the center of victim via 132B. Electromagnetic noise generated by an electrical signal traveling through aggressor via 130 may have approximately the same effect on victim via 132A and on victim via 132B. The difference in the effect on victim via 132A and the effect on victim via 132B may be zero or nearly zero when aggressor via 130 is positioned on perpendicular bisector 138 because aggressor via 130 may be approximately the same distance to victim via 132A and to victim via 132B. Thus, the positioning of aggressor via 130 relative to victim vias 132A, 132B, as depicted in FIG. 5C, may be the best-case scenario, relative to FIGS. 5A and 5B, for the behavior of differential signals traveling through victim vias 132A, 132B because the difference between the impact on victim via 132A and the impact on victim via 132B may be at or near a minimum.

In some examples, the coupling coefficient between aggressor via 110 and victim via 112A may be seven percent, and the coupling coefficient between aggressor via 110 and victim via 112B may be five percent. Thus, a one-volt difference between aggressor via 110 and victim vias 112A, 112B may result in seventy millivolts of noise on victim via 112A and fifty millivolts of noise on victim via 112B. The effect of the noise generated by aggressor via 110 on a differential signal traveling through victim vias 112A, 112B may be equal to the difference, which is twenty millivolts. In some examples, the coupling coefficient between aggressor via 120 and victim via 122A may be ten percent, and the coupling coefficient between aggressor via 120 and victim via 122B may be five percent.

Thus, a one-volt difference may result in fifty millivolts of noise on victim via 122A and one hundred millivolts of noise on victim via 122B, for an effective noise of fifty millivolts. In some examples, the coupling coefficient between aggressor via 130 and victim via 132A may be ten percent, and the coupling coefficient between aggressor via 130 and victim via 132B may be ten percent. Thus, a one-volt difference may result in one hundred millivolts of noise on victim via 132A and one hundred millivolts of noise on victim via 132B, for an effective noise of zero millivolts. Even though the noise on each of victim vias 132A, 132B may be greater than the noise on victim via 122B, the effective noise on differential signals traveling through victim vias 132A, 132B may be less than the effective noise on differential signals traveling through victim vias 122A, 122B.

Figure 6A:
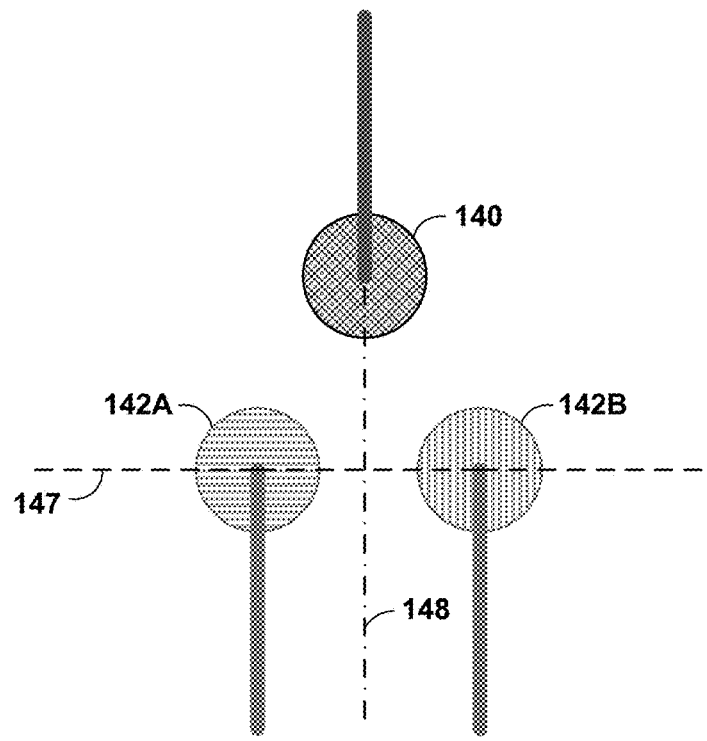
FIGS. 6A and 6B are conceptual diagrams illustrating two example placements of an aggressor via and two victim vias, in some examples of this disclosure.
Figure 6B:
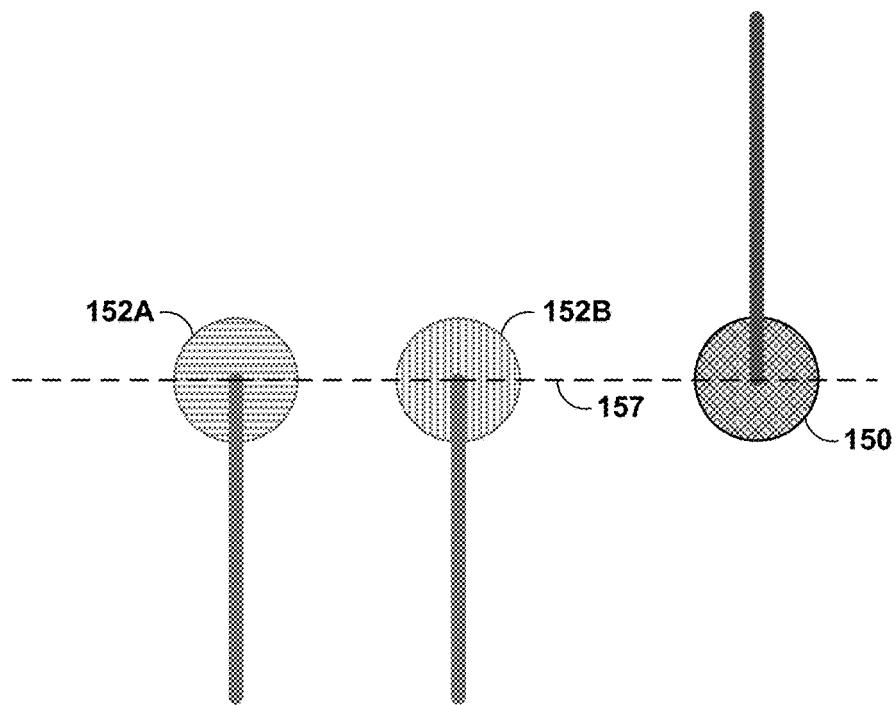

FIGS. 6A and 6B are conceptual diagrams illustrating two example placements of an aggressor via and two victim vias, in some examples of this disclosure. FIG. 6A depicts aggressor via 140 positioned approximately on perpendicular bisector 148 of a differential pair of victim vias 142A, 142B.

FIG. 6B depicts aggressor via 150 positioned approximately on line 157, where line 157 extends from the center of victim via 152A to the center of victim via 152B. The position of aggressor via 140 may be a best-case scenario for differential signals traveling through victim vias 142A, 142B, and aggressor via 150 may be a worst-case scenario for differential signals traveling through victim vias 152A, 152B. Table I depicts simulation results for electromagnetic noise at four frequencies.

TABLE I

Electromagnetic noise in decibels for two PCB arrangements and four frequencies.

| FIG | 700 kilohertz | | | 1.4 megahertz | | | 2.1 megahertz | | | 178 megahertz | | |
| --- | --- | --- | --- | --- | --- | --- | --- | --- | --- | --- | --- | --- |
| | A | B | Diff | A | B | Diff | A | B | Diff | A | B | Diff |
| 6A | −77 | −77 | −125 | −75 | −75 | −120 | −72 | −72 | −117 | −39 | −39 | −81 |
| 6B | −86 | −84 | −98 | −84 | −81 | −94 | −82 | −79 | −91 | −49 | −45 | −56 |
| Diff | −9 | −7 | 28 | −9 | −6 | 27 | −9 | −6 | 26 | −9 | −6 | 26 |

In the example of seven hundred kilohertz, the scenario of FIG. 6A shows an approximately equal impact on the electrical signals traveling through victim vias 142A, 142B of negative seventy-seven decibels. The impact on the differential signals traveling through victim vias 142A, 142B may be negative one hundred and twenty-five decibels. The impact on the differential signals may include even-mode components and odd-mode components, which may lead to unequal impacts on differential signals. In comparison, the scenario of FIG. 6B shows an impact on the electrical signals traveling through victim via 142A of negative eighty-six decibels and an impact on the electrical signals traveling through victim via 142B of negative eighty-four decibels. The impact on the differential signals traveling through victim vias 142A, 142B may be negative ninety-eight decibels. Thus, the difference between the impact on the differential signals traveling through victim vias 142A, 142B for the scenarios in FIGS. 6A and 6B may be twenty-eight decibels. A reduction of twenty-eight decibels in the impact on differential signals may be a substantial benefit and may allow tighter spacing between differential pairs of traces and a higher cross-sectional bandwidth for a PCB device. It may be desirable for some differential signals, such as clock signals, to have very low signal-to-noise ratios.

Returning to FIG. 3, pads 66A and 66B may act as aggressors with respect to a differential signal traveling through pads 26A and 26B. The effect of the electromagnetic noise generated by electrical signals traveling through pads 66A and 66B, and the trace vias connected to pads 66A and 66B, on pad 26A, and the trace via connected to pad 26A, may be approximately equal to an effect of the electromagnetic noise generated by electrical signals traveling through pads 66A and 66B on pad 26B. "Approximately equal" in this context may be defined as an effect on a differential signal that is at least thirty decibels less than the effect on each of the individual electrical signals that make up the differential signal.

Figure 7:
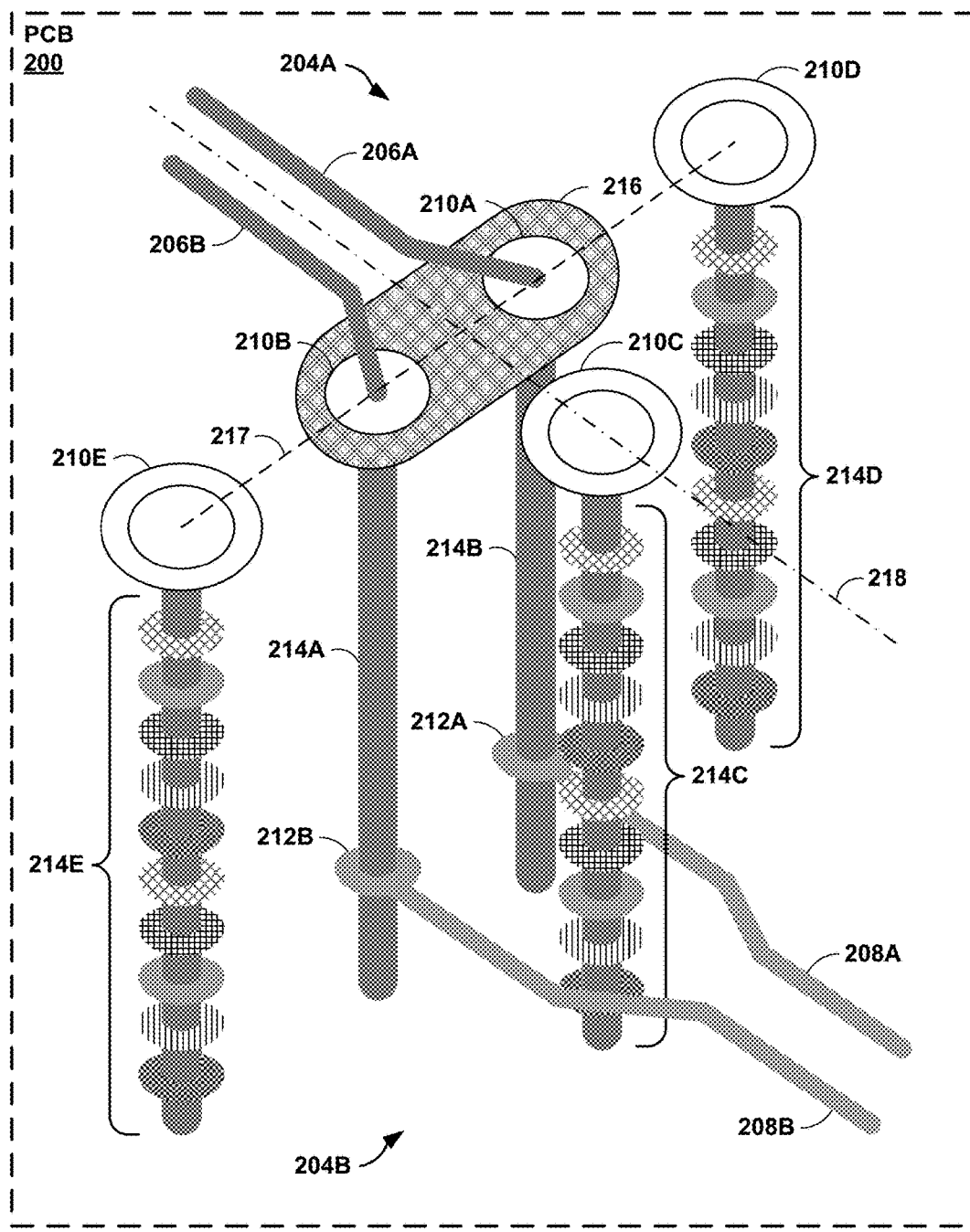
FIG. 7 is a conceptual diagram illustrating a PCB including a configuration of two PCB layers and five vias, in some examples of this disclosure.

FIG. 7 is a conceptual diagram illustrating a PCB 200 including a configuration of two PCB layers 204A, 204B and five vias 214A-214E, in some examples of this disclosure. Vias 214A-214E may include trace vias 214A and 214B and ground vias 214C-214E that span multiple PCB layers, including PCB layers 204A, 204B. PCB layer 204A may include traces 206A, 206B, pads 210A-210E, and antipad 216, which may surround vias 214A and 214B on more than one layer of PCB 200 such as PCB layers 204A and 204B. Traces 206A and 206B may be an edge-coupled pair on a single layer of PCB 200, or traces 206A and 206B may be a broadside-coupled pair where trace 206A is on a different layer than trace 206B. PCB layer 204B may include traces 208A, 208B, and pads 212A and 212B. In some examples, PCB 200 may include a thickness of approximately one hundred and forty-three mils (approximately thirty-six hundred micrometers), and PCB layers 204A, 204B may be separated by approximately one hundred and seventeen mils (approximately three millimeters). Depending on the thickness of PCB 200, trace vias 214A, 214B may be backdrilled to eliminate unused portions of trace vias 214A, 214B to improve impedance discontinuities and signal reflections.

Ground pad 210C is approximately symmetrically positioned about perpendicular bisector 218 of line 217 from pad 210A to pad 210B. Ground pads 210D and 210E are approximately symmetrically positioned about perpendicular bisector 218. Line 217 may be a straight line from the center of pad 210A to the center of pad 210B. Perpendicular bisector 218 may be defined as a line that includes all points that are equidistant from the center of pad 210A and the center of pad 210B. Perpendicular bisector 218 may also be defined as a line that is perpendicular to line 217 and intersects line 217 at an equal distance from the center of pad 210A and the center of pad 210B.

By positioning ground pad 210C approximately centered on perpendicular bisector 218, the effect of the electromagnetic noise generated by an aggressor structure on trace vias 214A and 214B may be approximately equal. The electromagnetic noise generated by the aggressor structure may be common to both of trace vias 214A and 214B, and both of pads 210A and 210B, and therefore approximately cancel out with respect to the differential signals traveling through traces 206A and 206B and vias 214A and 214B. By positioning ground pads 210D and 210E approximately symmetrically about perpendicular bisector 218, the effect of the electromagnetic noise generated by the aggressor structure and ground vias 214D and 214E on trace vias 214A and 214B may be approximately equal.

FIGS. 8A-8D are conceptual diagrams illustrating additional example placements of vias, traces, and antipads, in some examples of this disclosure. Each of PCBs 220, 250, 280, and 300 may include a ground pad, such as ground pad 234, 264A, 294, or 314A. The ground pad may be positioned between two traces, such as traces 222A and 222B, traces 252A and 252B, traces 282A and 282B, or traces 302A and 302B. The first ground pad may be approximately centered on a perpendicular bisector, such as perpendicular bisector 238, 268, 298, or 318. The perpendicular bisector may bisect and may be perpendicular to a line between two pads, such as pads 226A and 226B, pads 256A and 256B, pads 286A and 286B, or pads 306A and 306B. The layouts illustrated in FIGS. 8A-8D may be desirable for transmitting clock signals.

FIG. 8A depicts PCB 220, which may include traces 222A, 222B on a first layer and traces 224A, 224B on a second layer of PCB 220. PCB 220 may include two trace vias that are electrically connected to respective pads 226A, 226B and a ground via that are electrically connected to ground pad 234. Ground pad 234 may be approximately centered on perpendicular bisector 238. Diameter 240 of antipads 230A and 230B may be approximately thirty mils (approximately seven hundred and sixty micrometers). Diameter 242 of ground pad 234 may be approximately twenty mils (approximately five hundred micrometers). Spacing 243 between antipad 230B and ground pad 234 in the x-axis direction may be approximately seven mils (approximately one hundred and seventy-eight micrometers). Diameter 244 of ground pad 234 may be approximately ten mils (approximately two hundred and fifty-four micrometers). Diameter 246 of the pad 226A may be approximately thirty mils (approximately seven hundred and sixty-two micrometers). Center-on-center spacing 248 between pad 226A and ground pad 234 in the x-axis direction may be approximately thirty-two mils (approximately eight hundred and thirteen micrometers).

FIG. 8B depicts PCB 250, which may include traces 252A, 252B on a first layer and traces 254A, 254B on a second layer of the PCB 250. PCB 250 may include two trace vias that are electrically connected to respective pads 256A, 256B and three ground vias that are electrically connected to ground pads 264A-264C. Ground pad 264A may be approximately centered on perpendicular bisector 268. Center-on-center spacing 270 between pads 260A and 260B may be approximately thirty-six mils (approximately nine hundred and fourteen micrometers). Center-on-center spacing 272 of pads 260A and 264B may be approximately thirty-two mils (approximately eight hundred and thirteen micrometers). Spacing 274 between pads 260A and 264B may be approximately five mils (approximately one hundred and twenty-seven micrometers).

FIG. 8C depicts PCB 280, which may include traces 282A, 282B on a first layer and traces 284A, 284B on a second layer of the PCB 280. PCB 280 may include two trace vias that are electrically connected to respective pads 286A, 286B and a ground via that is electrically connected to ground pad 294. Ground pad 294 may be approximately centered on perpendicular bisector 298. Antipad 290 may include width 292 in the x-axis direction of approximately forty mils (approximately one millimeter). Width 292 may be the shortest dimension of antipad 290 and may be greater than eight hundred micrometers and less than fifteen hundred micrometers. Spacing 296 between antipad 292 and ground pad 294 may be approximately thirty-two mils (approximately eight hundred and thirteen micrometers).

FIG. 8D depicts PCB 300, which may include traces 302A, 302B on a first layer and traces 304A, 304B on a second layer of the PCB 300. PCB 300 may include two trace vias that are electrically connected to respective pads 306A, 306B and three ground vias that are electrically connected to ground pads 304A-304C. Ground pad 314A may be approximately centered on perpendicular bisector 318.

The layouts of PCBs 220 and 280 may be used when a small footprint is desirable because PCBs 220 and 280 include only one ground via. The layouts of PCBs 250 and 300 may be used when shielding power supply noise is desirable.

Figure 9A:
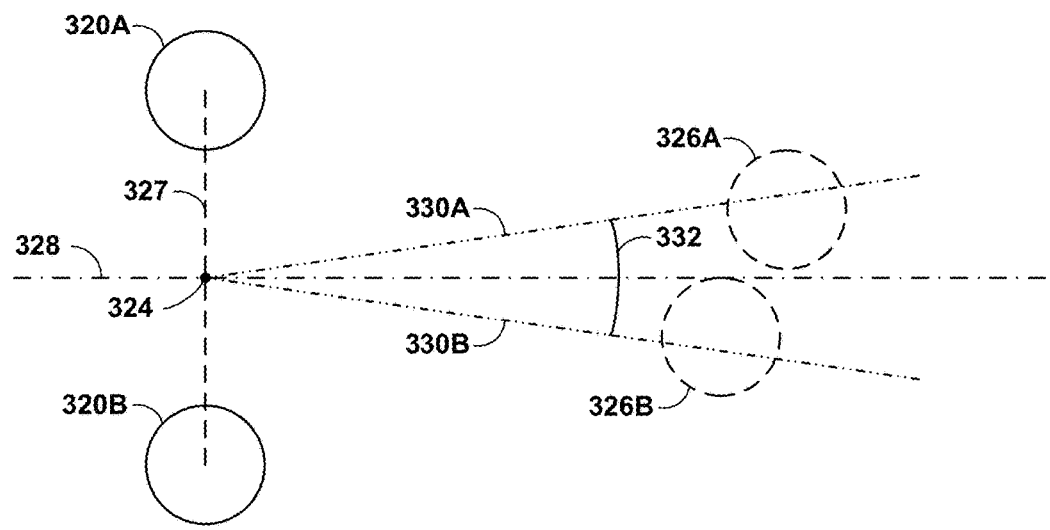
FIGS. 9A and 9B are conceptual diagrams illustrating the positioning of ground vias, in some examples of this disclosure.
Figure 9B:
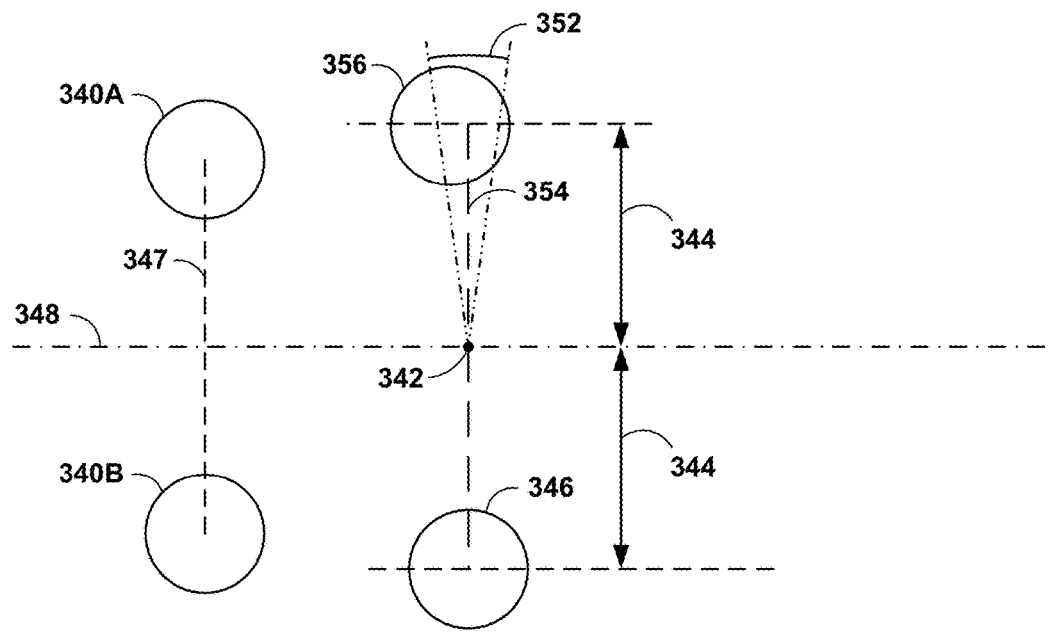

FIGS. 9A and 9B are conceptual diagrams illustrating the positioning of ground vias, in some examples of this disclosure. FIG. 9A illustrates a ground pad, such as ground pads 326A and 326B, that may be approximately centered on perpendicular bisector 328. Perpendicular bisector 328 may bisect line 327, which may include a first end at the center of pad 320A and a second end at the center of pad 320B. A ground pad may be "approximately centered" on perpendicular bisector 328 if the ground pad is less than five degrees from perpendicular bisector 328, where the five degrees is measured from intersection 324 of line 327 and perpendicular bisector 328. Arc 332 may include an angle of ten degrees because of the five-degree tolerance on both sides of perpendicular bisector 328. Ground pads 326A and 326B represent possible positions for a ground pad because the centers of ground pads 326A and 326B are within the tolerance band defined by lines 330A and 330B, each of which pass through intersection 324 and are separated from perpendicular bisector 328 by five degrees.

FIG. 9B illustrates two ground pads that may be approximately symmetrically positioned about perpendicular bisector 348. Perpendicular bisector 348 may bisect line 347, which may include a first end at the center of pad 340A and a second end at the center of pad 340B. Ground pad 346 may be positioned distance 344 from perpendicular bisector 348. For a second ground pad, such as ground pad 356, to be "approximately symmetrically positioned" with ground pad 346 about perpendicular bisector 348, the center of the second ground pad may be distance 344, or a distance that is within ten percent of distance 344, from intersection 342 of perpendicular bisector 348 and line 354. For a second ground pad to be "approximately symmetrically positioned" with ground pad 346 about perpendicular bisector 348, the second ground pad may also be within five degrees of line 354. Line 354 may be perpendicular to perpendicular bisector 348 and may extend from the center of ground pad 346 to intersection 342. The five-degree tolerance band may be measured from intersection 342 such that arc 352 may include an angle of ten degrees because of the five-degree tolerance on both sides of perpendicular bisector 328.

Figure 10:
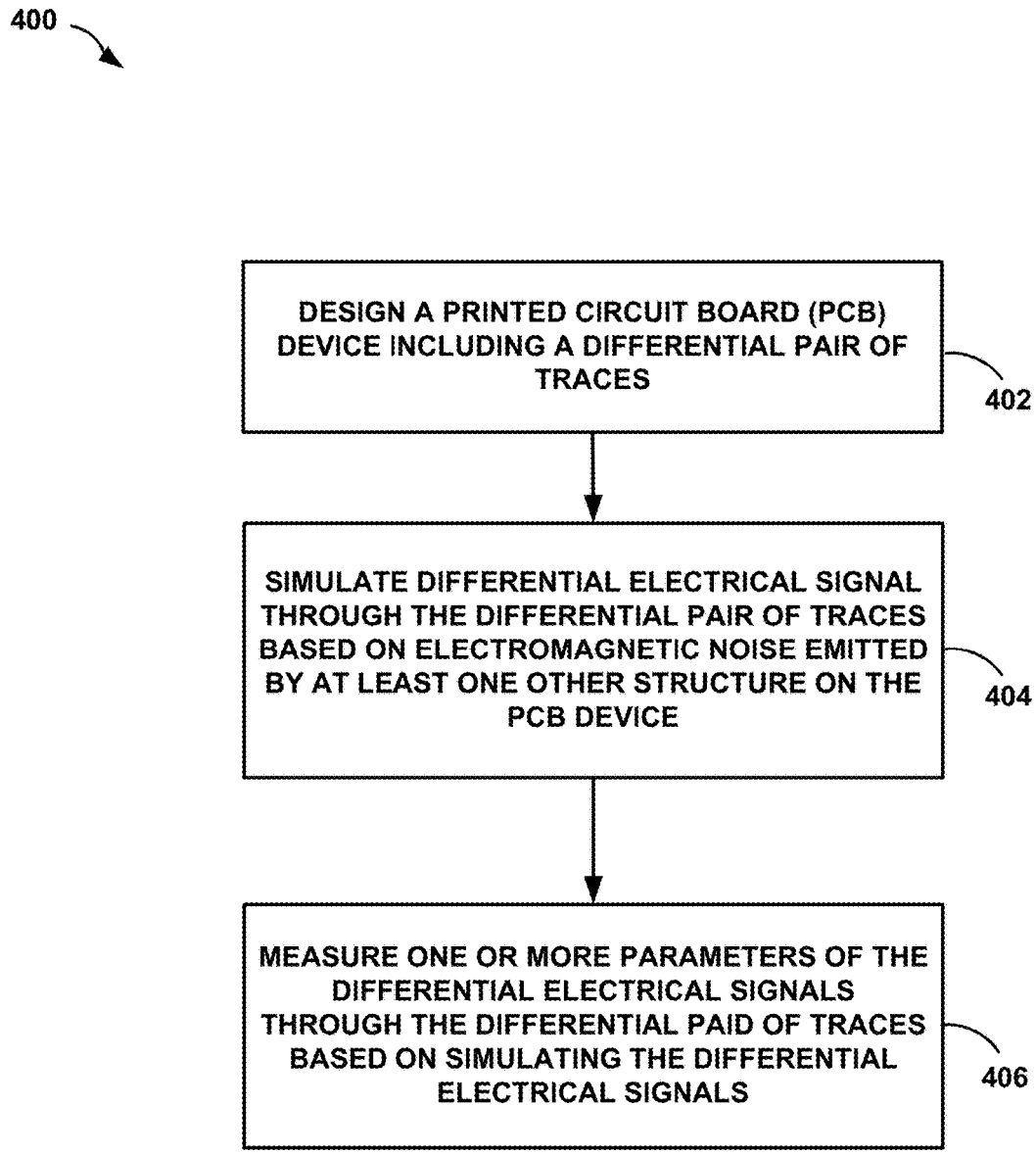
FIG. 10 is a flowchart illustrating an example process for designing a PCB, in some examples of this disclosure.

FIG. 10 is a flowchart illustrating an example process 400 for designing a PCB, in some examples of this disclosure. Process 400 is described with reference to PCB 20 in FIGS. 2 and 3, although other components, such as PCBs 2, 200, 220, 250, 280, 300 in FIGS. 1 and 7-8D may exemplify similar techniques.

The process of FIG. 10 may include designing the PCB device 20 including a differential pair of traces 22A, 22B, 24A, and 24B ("traces 22 and 24") (402). The design may occur in a computer-aided design (CAD) software, such as Allegro®, Altium®, Ansys®, and/or any other suitable software application.

The process of FIG. 10 may further include simulating differential electrical signals through the differential pair of traces 22 and 24 based on electromagnetic noise emitted by at least one other structure on the PCB device 20 (404). The other structures on PCB 20 may include ground pads 34A, 34B, 36A, 36B, each of which are electrically connected to a ground via. The other structures on PCB 20 may include traces 62 and 64 and traces 82 and 84. Electrical signals traveling through the other structures may generate electromagnetic noise that may affect the behavior of differential electrical signals traveling through traces 22 and 24.

A simulation of electromagnetic noise in PCB 20 may include the consideration of whether the layer with traces 22 and 24 is a microstrip layer or a stripline layer. A microstrip layer may include quasi-TEM mode propagation, and a stripline layer may include TEM mode propagation. The simulation may also include a measurement of the arrival times of each signal of a differential signal. Depending on the layout, length, and impedance of traces 22 and 24, the signals may not arrive at the same time. Traces 22A and 22B may be mono-stripline, which is edge coupling, or dual stripline, which is broadside coupling.

The process of FIG. 10 may further include measuring one or more parameters of the differential electrical signals through the differential pair of traces based on simulating the differential electrical signals (406). The one or more parameters may include insertion loss, return loss, impedance, far end crosstalk, and near end crosstalk. Insertion loss may be defined as the loss of signal power resulting from the insertion of a device along traces 22 and 24. Return loss may be defined as the loss of power in the signal returned or reflected by a discontinuity along traces 22 and 24. Impedance may be defined as the effective alternating-current (AC) resistance of traces 22 and 24, which may include capacitive reactance and inductive reactance. Impedance may be defined as the ratio of transverse components of the electric field and the magnetic field. Far end crosstalk may be defined as the interference between traces 22 and 24 measured at a receiving end of traces 22 and 24 with respect to a transmitting end of traces 22 and 24. Near end crosstalk may be defined as the interference between traces 22 and 24 at the transmitting end of traces 22 and 24.

A designer may use the measurements of the one or more parameters from the simulation to determine center-on-center spacing 60 between differential pairs of traces on PCB 20. The designer may determine spacing 60 by, for example, applying a threshold impedance or a threshold for crosstalk. The designer may reduce spacing 60 in the simulation until the impedance or crosstalk exceeds the respective threshold. The designer may establish spacing 60 such that the impedance and/or crosstalk do not exceed the respective thresholds.

For example, a specific value of impedance may be desirable. A simulation may include measurements of the impedance at different points of time. The layout of structures on PCB 20 that results in the least variation from the specific value of impedance may be a desirable layout.

A designer may also simulate a differential signal traveling through traces 62 and 64 based on electromagnetic noise generated by traces 22 and 24. The designer may measure the one or more parameters for traces 62 and 64. The designer may determine spacing 60 based on the simulation of differential signals traveling through traces 22 and 24 and traces 62 and 64. Thus, the designer may measure the electromagnetic noise in both directions.

Figure 11:
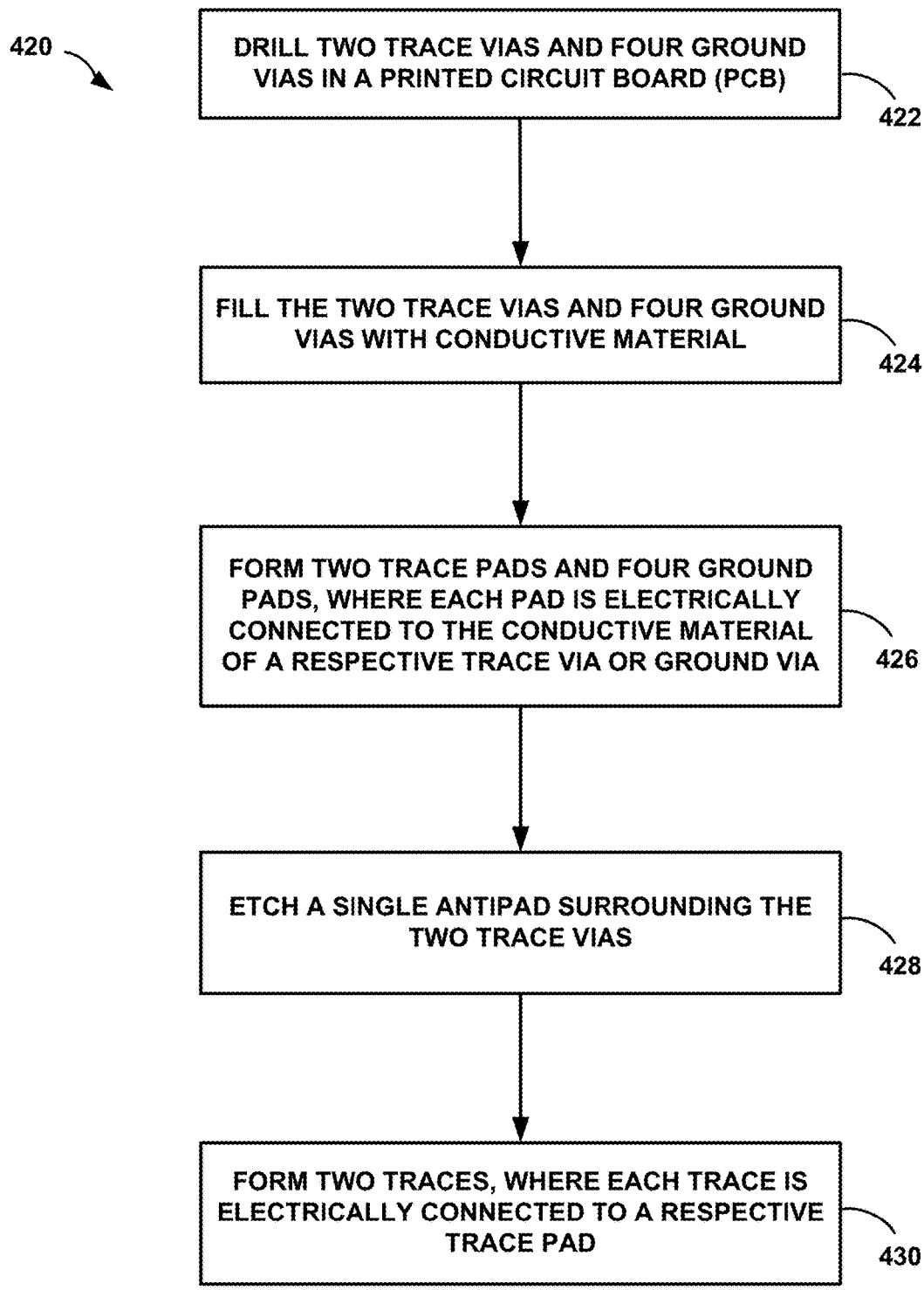
FIG. 11 is a flowchart illustrating an example process for fabricating a PCB, in some examples of this disclosure.

FIG. 11 is a flowchart illustrating an example process 420 for fabricating a PCB, in some examples of this disclosure. Process 420 is described with reference to PCB 20 in FIGS. 2 and 3, although other components, such as PCBs 2, 200, 220, 250, 280, 300 in FIGS. 1 and 7-8D may exemplify similar techniques.

The process of FIG. 11 may include drilling two trace vias and four ground vias in a PCB (422). The drilling may occur with a laser or a mechanical drill. In some examples, the trace vias may include diameters on the order of five hundred micrometers, and the ground vias may include diameters on the order of two hundred micrometers.

The process of FIG. 11 may further include filling the two trace vias and the four ground vias with conductive material (424). The conductive material may include copper, aluminum, solder, and/or any other suitable conductive material.

The process of FIG. 11 may further include forming trace pads 26A, 26B and ground pads 34A, 34B, 36A, 36B (426). Each of trace pads 26A and 26B is electrically connected to a respective trace via, and each of ground pads 34A, 34B, 36A, and 36B is electrically connected to a respective ground via. Trace pads 26A, 26B and ground pads 34A, 34B, 36A, 36B may be positioned on a first layer of PCB 20. Ground pads 34A and 34B may be approximately symmetrically positioned about perpendicular bisector 38. Ground pads 36A and 36B may be approximately symmetrically positioned about perpendicular bisector 38.

The process of FIG. 11 may further include etching single antipad 30 surrounding the two trace vias (428). The conductive material of PCB 20 may be etched using an acid to create antipad 30 on all layers except where connections are desirable. Antipad 30 may prevent the flow of electricity between pads 26A and 26B and the conductive material surrounding antipad 30.

The process of FIG. 11 may further include forming traces 22A and 22B (430). Traces 22A and 22B may be formed by etching the conductive material of PCB 20 to isolate traces 22A and 22B from the conductive material of PCB 20.

Various examples have been described. These and other examples are within the scope of the following claims.

What is claimed is:

1. An electronic device comprising a printed circuit board (PCB) device, the PCB device comprising:
   a first trace on a first layer;
   a second trace on a second layer, wherein the second trace is electrically isolated from the first trace;
   a first trace via including a first pad on the first layer, wherein the first pad is electrically connected to the first trace;
   a second trace via including a second pad on the second layer, wherein the second pad is electrically connected to the second trace;
   an antipad surrounding the first trace via and the second trace via;
   a first ground via through the first layer and electrically connected to a ground plane, wherein the first ground via includes a first ground pad on the first layer positioned between the first trace and the second trace;
   a second ground via through the first layer and electrically connected to the ground plane, wherein the second ground via includes a second ground pad on the first layer, wherein the first ground pad and the second ground pad are approximately symmetrically positioned about a perpendicular bisector of a line from the first pad to the second pad;
   a third ground via through the first layer and electrically connected to the ground plane, wherein the third ground via includes a third ground pad on the first layer;
   a fourth ground via through the first layer and electrically connected to the ground plane, wherein the fourth ground via includes a fourth ground pad on the first layer, wherein the third ground pad and the fourth ground pad are approximately symmetrically positioned about the perpendicular bisector of the line from the first pad to the second pad.

2. The electronic device of claim 1, wherein the antipad comprises a first antipad, wherein the perpendicular bisector is a first perpendicular bisector, and wherein the PCB device further comprises:
   a third trace on the first layer, wherein the third trace is electrically isolated from the first trace and the second trace;

a fourth trace on the second layer, wherein the fourth trace is electrically isolated from the first trace, the second trace, and the third trace;

a third trace via including a third pad on the first layer, wherein the third pad is electrically connected to the third trace;

a fourth trace via including a fourth pad on the second layer, wherein the fourth pad is electrically connected to the fourth trace;

a second antipad surrounding the third trace via and the fourth trace via;

a fifth ground via electrically connected to the ground plane, wherein the fifth ground via includes a fifth ground pad on the first layer positioned between the third trace and the fourth trace;

a sixth ground via electrically connected to the ground plane, wherein the sixth ground via includes a sixth ground pad on the first layer, wherein the fifth ground pad and the sixth ground pad are approximately symmetrically positioned about a second perpendicular bisector of a line from the third pad to the fourth pad;

a seventh ground via electrically connected to the ground plane, wherein the seventh ground via includes a seventh ground pad on the first layer; and an eighth ground via electrically connected to the ground plane, wherein the eighth ground via includes an eighth ground pad on the first layer, wherein the seventh ground pad and the eighth ground pad are approximately symmetrically positioned about the second perpendicular bisector.

3. The electronic device of claim 2, wherein a center-on-center spacing from the first antipad to the second antipad is less than three millimeters.

4. The electronic device of claim 2, wherein:
the third trace via is configured to generate first electromagnetic noise,
the fourth trace via is configured to generate second electromagnetic noise, and
wherein an effect of the first electromagnetic noise on the first trace via is approximately equal to an effect of the second electromagnetic noise on the second trace via.

5. The electronic device of claim 2, wherein the PCB device further comprises:
a fifth trace on the first layer, wherein the fifth trace is electrically isolated from the first trace and the second trace;
a sixth trace on the second layer, wherein the sixth trace is electrically isolated from the first trace, the second trace, and the fifth trace;
a fifth trace via including a fifth pad on the first layer, wherein the fifth pad is electrically connected to the fifth trace;
a sixth trace via including a sixth pad on the second layer, wherein the sixth pad is electrically connected to the sixth trace;
a third antipad surrounding the fifth trace via and the sixth trace via;
a ninth ground via electrically connected to the ground plane, wherein the ninth ground via includes a ninth ground pad on the first layer positioned between the fifth trace and the sixth trace;
a tenth ground via electrically connected to the ground plane, wherein the tenth ground via includes a tenth ground pad on the first layer, wherein the ninth ground pad and the tenth ground pad are approximately symmetrically positioned about a third perpendicular bisector of a line from the fifth pad to the sixth pad;

an eleventh ground via electrically connected to the ground plane, wherein the eleventh ground via includes an eleventh ground pad on the first layer; and a twelfth ground via electrically connected to the ground plane, wherein the twelfth ground via includes a twelfth ground pad on the first layer, wherein the eleventh ground pad and the twelfth ground pad are approximately symmetrically positioned about the third perpendicular bisector.

6. The electronic device of claim 5, wherein a center-on-center spacing from the second antipad to the third antipad is less than three millimeters.

7. The electronic device of claim 1, wherein:
a longest dimension of the antipad measured across the antipad is greater than fifteen hundred micrometers and less than three millimeters; and
a shortest dimension of the antipad measured across the antipad is greater than seven hundred and fifty micrometers and less than fifteen hundred micrometers.

8. The electronic device of claim 1, wherein the PCB device further comprises:
a first capacitor electrically connected in series with the first trace; and
a second capacitor electrically connected in series with the second trace.

9. The electronic device of claim 1, wherein:
a center-on-center spacing from a center of the first pad to a center of the first ground pad is less than fifteen hundred micrometers;
a center-on-center spacing from the second pad to the second ground pad is less than fifteen hundred micrometers.

10. The electronic device of claim 1, wherein the first layer and the second layer are a same layer.

11. The electronic device of claim 1, wherein the first layer and the second layer are different layers.

12. A method for constructing a printed circuit board (PCB), the method comprising:
drilling a first trace via, a second trace via, a first ground via, a second ground via, a third ground via, and a fourth ground via in the PCB;
filling the first trace via, a second trace via, a first ground via, a second ground via, a third ground via, and a fourth ground via with conductive material;
forming a first pad on a first layer of the PCB that is electrically connected to the conductive material of the first trace via;
forming a second pad on a second layer that is electrically connected to the conductive material of the second trace via;
forming a first ground pad on the first layer that is electrically connected to the conductive material of the first ground via, wherein the first ground pad is positioned between the first trace and the second trace;
forming a second ground pad on the first layer that is electrically connected to the conductive material of the second ground via, wherein the first ground pad and the second ground pad are approximately symmetrically positioned about a perpendicular bisector of a line from the first pad to the second pad;
forming a third ground pad on the first layer that is electrically connected to the conductive material of the third ground via;
forming a fourth ground pad on the first layer that is electrically connected to the conductive material of the fourth ground via, wherein the third ground pad and the fourth ground pad are approximately symmetrically positioned about the perpendicular bisector;

etching an antipad surrounding the first trace via and the second trace via; and forming a first trace on the first layer and a second trace on the second layer, wherein the first trace is electrically connected to the first pad, and wherein the second trace is electrically connected to the second pad.

13. The method of claim 12, wherein:

a longest dimension of the antipad is greater than fifteen hundred micrometers and less than three millimeters; and a shortest dimension of the antipad that is greater than eight hundred micrometers and less than fifteen hundred micrometers.

14. The method of claim 12, wherein the first layer and the second layer are a same layer.

15. The method of claim 12, wherein the first layer and the second layer are different layers.

\* \* \* \* \*